(12) United States Patent
Sotome

(10) Patent No.: US 11,956,961 B2
(45) Date of Patent: Apr. 9, 2024

(54) SEMICONDUCTOR MEMORY DEVICE AND METHOD OF MANUFACTURING THEREOF

(71) Applicant: Kioxia Corporation, Tokyo (JP)

(72) Inventor: Shinichi Sotome, Yokkaichi (JP)

(73) Assignee: Kioxia Corporation, Tokyo (JP)

( * ) Notice: Subject to any disclaimer, the term of this patent is extended or adjusted under 35 U.S.C. 154(b) by 283 days.

(21) Appl. No.: 17/445,619

(22) Filed: Aug. 23, 2021

(65) Prior Publication Data

US 2022/0302163 A1 Sep. 22, 2022

(30) Foreign Application Priority Data

Mar. 16, 2021 (JP) .................................. 2021-042801

(51) Int. Cl.
| | |
|---|---|
| *H01L 21/306* | (2006.01) |
| *H01L 21/02* | (2006.01) |
| *H10B 43/27* | (2023.01) |

(52) U.S. Cl.
CPC ....... *H10B 43/27* (2023.02); *H01L 21/02236* (2013.01); *H01L 21/02252* (2013.01); *H01L 21/30604* (2013.01)

(58) Field of Classification Search
CPC ........ H10B 43/27; H10B 41/27; H10B 43/35; H01L 21/02236; H01L 21/02252; H01L 21/30604; H01L 21/32; H01L 21/32105; H01L 21/32134
See application file for complete search history.

(56) References Cited

U.S. PATENT DOCUMENTS

| | | | |
|---|---|---|---|
| 9,768,192 B1 * | 9/2017 | Nakamura | ............. H10B 43/27 |
| 9,966,299 B2 | 5/2018 | Tang et al. | |
| 2012/0003800 A1 * | 1/2012 | Lee | ..................... H01L 29/7889 |
| | | | 257/E21.645 |
| 2017/0271261 A1 * | 9/2017 | Tsutsumi | ............... H10B 43/10 |
| 2018/0006049 A1 | 1/2018 | Inomata et al. | |
| 2021/0066347 A1 | 3/2021 | Titus et al. | |

\* cited by examiner

*Primary Examiner* — Kyoung Lee
(74) *Attorney, Agent, or Firm* — Oblon, McClelland, Maier & Neustadt, L.L.P.

(57) ABSTRACT

A semiconductor memory device includes a semiconductor substrate, a first stacked body including a plurality of first insulating layers and a plurality of first conductive layers alternately stacked in a first direction intersecting a surface of the semiconductor substrate, a second stacked body including a plurality of second insulating layers and a plurality of second conductive layers alternately stacked in the first direction of the first stacked body, a third insulating layer arranged between the first stacked body and the second stacked body, and a pillar penetrating the first stacked body, the third insulating layer, and the second stacked body, the pillar comprising a semiconductor layer extending in the first direction and a charge storage layer extending in the first direction and arranged between the plurality of first conductive layers and the semiconductor layer and between the plurality of second conductive layers and the semiconductor layer.

12 Claims, 18 Drawing Sheets

SEMICONDUCTOR MEMORY DEVICE AND METHOD OF MANUFACTURING THEREOF

CROSS REFERENCE TO RELATED APPLICATION(S)

This application is based upon and claims the benefit of priority from the prior Japanese Patent Application JP2021-042801, filed on Mar. 16, 2021, the entire contents of which are incorporated herein by reference.

FIELD

Embodiments described herein relate generally to semiconductor memory device and methods of manufacturing thereof.

BACKGROUND

Semiconductor packages using NAND flash memory as a semiconductor memory device is known. In order to increase the capacity of such NAND flash memory, a three-dimensional NAND flash memory having a configuration that a large number of memory cells are stacked has been put into practical use. In such multilayer three-dimensional NAND flash memory, it is an issue to improve reliability and manufacturing yield.

DETAILED DESCRIPTION

Figure 1:
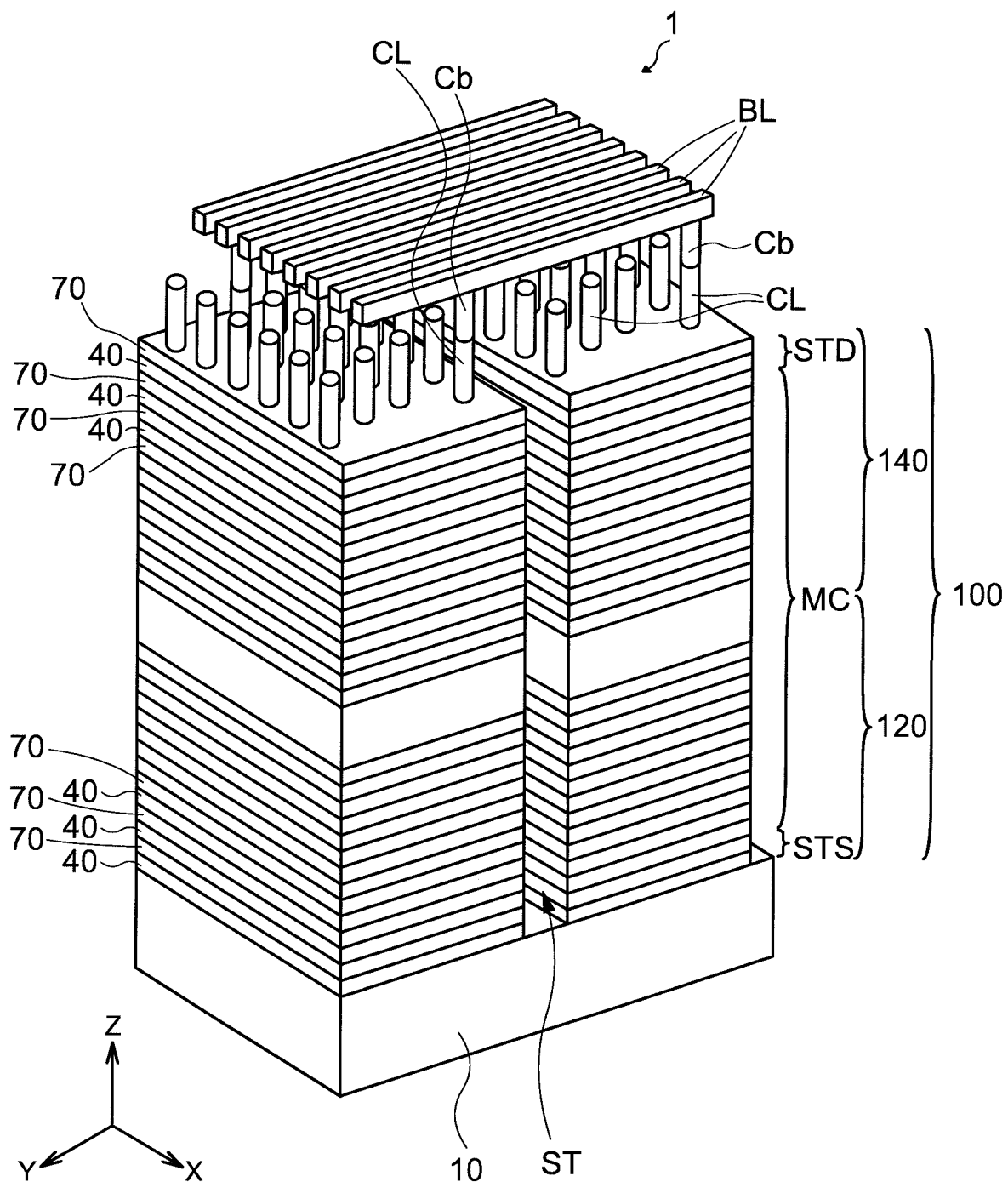
FIG. 1 is a perspective view showing an entire configuration of a semiconductor memory device according to one embodiment.

A semiconductor memory device according to the present embodiment includes a semiconductor substrate, a first stacked body including a plurality of first insulating layers and a plurality of first conductive layers alternately stacked in a first direction intersecting a surface of the semiconductor substrate, a second stacked body including a plurality of second insulating layers and a plurality of second conductive layers alternately stacked in the first direction of the first stacked body, a third insulating layer arranged between the first stacked body and the second stacked body and having a film thickness larger than a film thickness of each of the plurality of first insulating layer and each of the plurality of second insulating layer, and a pillar penetrating the first stacked body, the third insulating layer, and the second stacked body, the pillar comprising a semiconductor layer extending in the first direction and a charge storage layer extending in the first direction and arranged between the plurality of first conductive layers and the semiconductor layer and between the plurality of second conductive layers and the semiconductor layer. The pillar has a first region facing one of the plurality of first conductive layers and a connecting part facing the third insulating layer. A width of the connection part in a second direction orthogonal to the first direction is larger than a width of the first region in the second direction. A film thickness of the semiconductor layer at the connection part is larger than a film thickness of the semiconductor layer at the first region.

Hereinafter, a semiconductor memory device and a method of manufacturing thereof according to the present embodiment will be described in detail by referring to the drawings. In the following description, components having substantially the same functions and configurations are denoted by the same reference numerals or with the same reference numerals followed by the addition of an alphabet, and will be described in duplicate only when necessary. Each of the embodiments described below exemplifies a device and a method for embodying the technical idea of the present embodiment. The technical idea of the embodiment is not specified as the material, shape, structure, arrangement, and the like of the parts described below. Various modifications may be made to the technical idea of the embodiment in addition to the scope of the claims.

For the sake of clarity of description, the drawings may be schematically represented with respect to widths, thicknesses, shapes, and the like of the respective parts compared with actual embodiments, but are merely an example and do not limit the interpretation of the present invention. In this specification and each drawing, elements having the same functions as those described with reference to the preceding drawings are denoted by the same reference numerals, and a repetitive description thereof may be omitted.

A plurality of films formed by the same process has the same layer structure and is made of the same material. In this specification, even when each of the plurality of films plays a different function or role, a plurality of films formed by the same process is treated as films existing in the same layer.

In the embodiments, the direction from a substrate to a memory cell is referred to as an upward direction. On the contrary, the direction from a memory cell to a substrate is referred to as a downward direction. As described above, for convenience of explanation, the phrase "upward" or "downward" is used for explanation, but, for example, a substrate and a memory cell may be arranged so that the vertical relationship is opposed to that shown in the drawings. In the following description, for example, the expression "a memory cell on a substrate" merely describes the vertical relationship between the substrate and the memory cell as described above, and other member may be arranged between the substrate and the memory cell.

The expressions "a includes A, B or C," "a includes any of A, B and C," "α includes one selected from a group consisting of A, B and C," and the like do not exclude the case where α includes multiple combinations of A to C unless otherwise specified. Furthermore, these expressions do not exclude the case where α includes other elements.

The following embodiments may be combined with each other as long as there is no technical contradiction.

In the following embodiments, a memory cell array is described as an example of a semiconductor device, but the disclosed techniques can be applied to a semiconductor device other than a memory cell array (e.g., CPUs, display units, interposers, etc.).

Further, in each of the following embodiments, the configuration of the peripheral (CMOS) circuit is not particularly mentioned. The semiconductor memory device may have a CMOS circuit partitioned in another region of the semiconductor substrate. The CMOS circuit chip and the memory cell array chip may be formed separately on the different semiconductor substrates in the semiconductor memory device. In this case, the upper surface of the memory cell array chip and the upper surface of the CMOS circuit chip may be bonded to each other. The semiconductor memory device may be formed integrally with the memory cell array on the CMOS chip.

First Embodiment

[Memory Cell Array Configuration]

The configuration of the memory cell array according to the present embodiment will be described with reference to FIG. 1. FIG. 1 is a schematic perspective view showing an arrangement of the elements of a memory cell array 1 according to the present embodiment.

In FIG. 1, two directions parallel to main surface of the substrate 10 and perpendicular to each other are referred to as X-direction and Y-direction, the surface parallel to main surface of the substrate 10 is referred to as XY plane. The direction perpendicular to both of these X-direction and Y-direction referred to as Z-direction (stacking direction).

As shown in FIG. 1, the memory cell array 1 includes the substrate 10, a stacked body 100 arranged on the substrate 10, a plurality of columnar bodies CL, and a plurality of bit lines BL arranged on the stacked body 100.

The substrate 10 is, for example, a semiconductor substrate made of P-type silicon (Si) containing P-type impurity such as boron (B). On the surface of the substrate 10, for example, P-type well region containing the P-type impurity is arranged.

The stacked body 100 includes a lower layer stacked body 120 disposed on the substrate 10 and an upper layer stacked body 140 disposed on the lower layer stacked body 120 opposite side (Z direction) of the substrate 10 (here, referred to as the stacked body 100 when the lower layer stacked body 120 and the upper layer stacked body 140 are not distinguished from each other). In the stacked body 100, a plurality of conductive layers 70 which are insulated from each other, openings ST and MH common to the plurality of conductive layers 70 are formed. The openings ST and MH extend in the stacking direction (Z-direction) and reach the substrate 10 through the stacked body 100. The opening ST extends in the X-direction and separates the stacked body 100 into several blocks in the Y-direction. As will be described in detail later, the columnar body CL are formed in the opening MH (see FIG. 2).

The columnar body CL is formed in a cylindrical form extending in the stacked body 100 in the stacking direction. The plurality of columnar bodies CL is arranged in a staggered manner, for example. Alternatively, the plurality of columnar bodies CL may be arranged in a square lattice along the X-direction and Y-direction.

The plurality of bit lines BL is separated from each other in the X-direction, and each of the bit line BL extends in the Y-direction.

An upper end of a semiconductor layer 20 (reference FIG. 2) of the columnar body CL to be described later is connected to the bit line BL via a contact part Cb. The plurality of columnar bodies CL selected one by one from the respective blocks separated in the Y-direction by the opening ST are connected to one common bit line BL.

An insulating layer 40 is formed in the opening ST and an insulating layer 41 is formed on the stacked body 100. However, for convenience of explanation, these insulating layers are omitted in FIG. 1.

Figure 2:
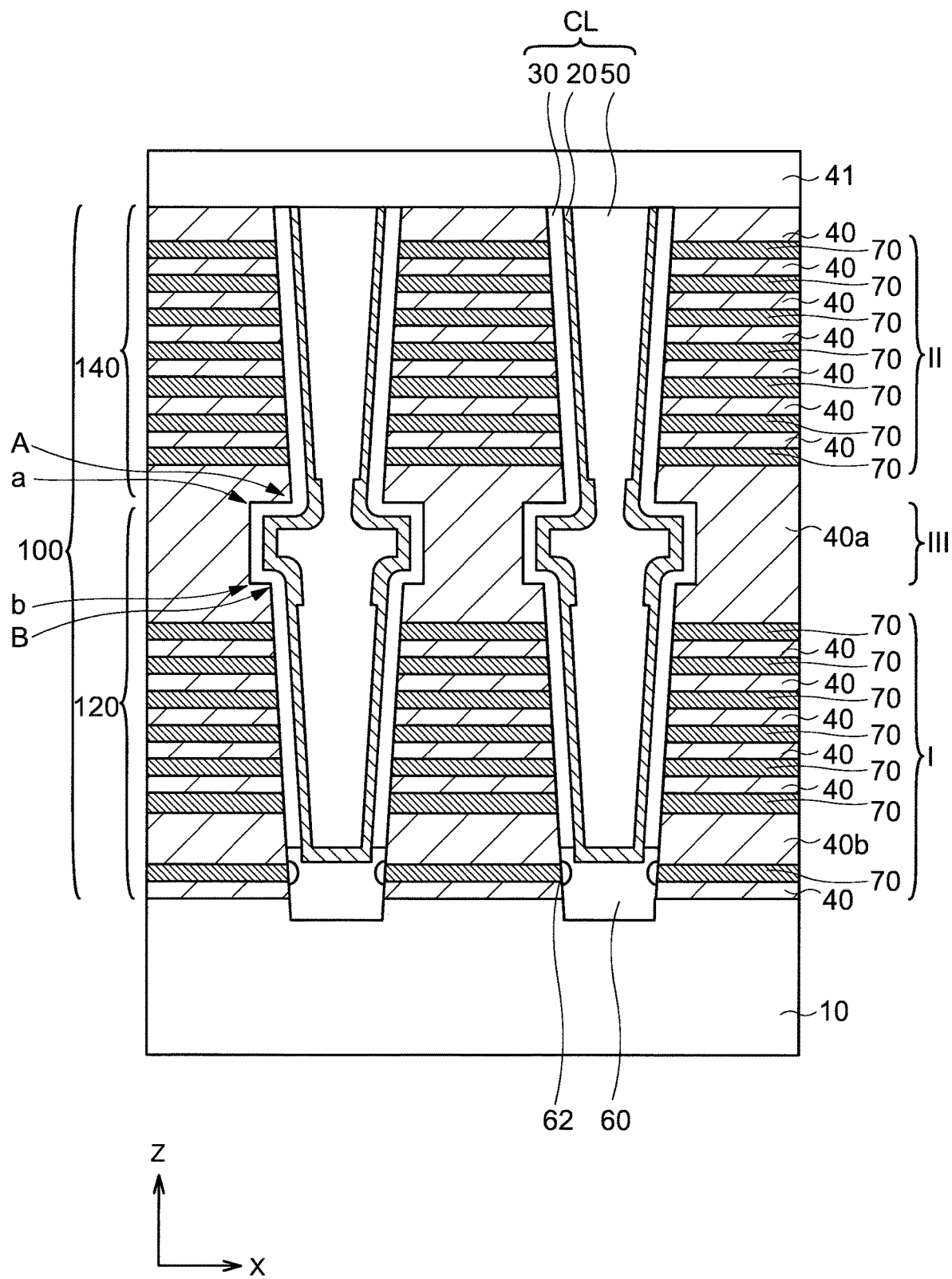
FIG. 2 is a cross-sectional view showing an entire configuration of a semiconductor memory device according to one embodiment.

FIG. 2 is a schematic cross-sectional view of the memory cell array 1. X-direction and Z-direction shown in FIG. 2 corresponds to the X-direction and Z-direction shown in FIG. 1.

The stacked body 100 includes a plurality of conductive layers 70 staked on the substrate 10. The plurality of conductive layers 70 is periodically stacked in a direction perpendicular to the main surface of the substrate 10 (stacking direction, Z-direction) via a plurality of insulating layers 40. Each of the conductive layers 70 is a single layer. That is, when observing the cross-sectional shape of one conductive layer 70, a single material may be continuous in the film thickness direction (Z-direction) of the conductive layer 70. Further, the boundary may not be present within one conductive layer 70. The conductive layer 70 may be made of tungsten, for example.

The insulating layer 40 is formed between the conductive layer 70 and the conductive layer 70 adjacent to each other in the stacking direction. The plurality of conductive layers 70 and the plurality of insulating layers 40 are alternately arranged. The insulating layer 40 is also formed between the substrate 10 and the lowermost conductive layer 70. An insulating layer 40a is disposed at an interface between the lower layer stacked body 120 and the upper layer stacked body 140 (referred to as the insulating layer 40 when the insulating layer 40a is not distinguished from the other insulating layer 40). The film thickness in the stacking direction of the insulating layer 40a disposed at the interface between the lower layer stacked body 120 and the upper layer stacked body 140 is larger than the film thickness in the stacking direction of the other insulating layer 40 between the conductive layers 70. The film thickness in the stacking direction of the insulating layer 40a disposed at the interface between the lower layer stacked body 120 and the upper layer stacked body 140 may be larger than, for example, the film thickness in the stacking direction of an insulating layer 40b (here, referred to as the insulating layer 40 when the insulating layer 40b is not distinguished from the other insulating layer 40) on the lowermost layer of the conductive layer 70 (the control gate of the source-side selecting transistor STS). The conductive layers 70 adjacent to each other in the stacking directions may be insulated from each other, and the material of the insulating layer 40 may be, for example, silicon oxide such as silicon dioxide ($SiO_2$) or TEOS (Tetra Ethyl Ortho Silicate). The insulating layer 40 is deposited, for example, using a Chemical Vapor Deposition device.

The columnar body CL is formed in the opening MH. The columnar body CL includes an epitaxial grown layer 60, a memory layer 30, the semiconductor layer 20, and an insulating core layer 50. The columnar body CL includes the epitaxial grown layer 60 in the vicinity of the substrate 10. The epitaxial grown layer 60 is formed, for example, by epitaxially growing a silicon single crystal on the substrate 10 containing a silicon single crystal.

On the epitaxial grown layer 60, the memory layer 30, the semiconductor layer 20, and the insulating core layer 50 extending in the stacking direction are formed. The core layer 50 is arranged in the vicinity of the center of the opening MH in a columnar shape. The semiconductor layer 20 is arranged around the core layer 50 in a bottomed cylindrical shape. The lower end of the semiconductor layer 20 is connected to the epitaxial grown layer 60. The memory layer 30 is arranged around the semiconductor layer 20 in a cylindrical shape. The memory layer 30 is in contact with the inner surface of the opening MHs (the conductive layer 70 and the insulating layer 40 that are alternately stacked). The memory layer 30 is in contact with the semiconductor layer 20. In other words, the semiconductor layer 20 extends through the stacked body 100. The memory layer 30 (including a charge storage layer 32 to be described later) is arranged between the conductive layer 70 and the semiconductor layer 20.

The columnar body CL includes a first narrowed part A having a small width (diameter, distance between outer surfaces) in the X-direction at the interface between the lower layer stacked body 120 and the upper layer stacked body 140. The first narrowed part A is adjacent to a second region faces to the conductive layers 70 of the upper layer stacked body 140. The first narrowed part A faces to the insulating layer 40a at the interface between the lower layer stacked body 120 and the upper layer stacked body 140. The width of the first narrowed part A of the columnar body CL in the X-direction may be smaller than the width of the second region faces to the conductive layers 70 of the upper layer stacked body 140 in the X-direction. The width of the first narrowed part A of the columnar body CL in the X-direction may be smaller than the width of the first region facing the conductive layers 70 of the lower layer stacked body 120 in the X-direction.

The columnar body CL includes a first widened part a having a large width in the X-direction at the interface between the lower layer stacked body 120 and the upper layer stacked body 140. The first widened part a is adjacent to the first narrowed part A. The first widened part a faces to the insulating layer 40a at the interface between the lower layer stacked body 120 and the upper layer stacked body 140. The width of the first widened part a of the columnar body CL in the X-direction is larger than the width of the first narrowed part A in the X-direction. The width of the first widened part a of the columnar body CL in the X-direction is larger than the width of the second region faces to the conductive layers 70 of the upper layer stacked body 140 in the X-direction. The width of the first widened part a of the columnar body CL in the X-direction is larger than the width of the first region facing the conductive layers 70 of the lower layer stacked body 120 in the X-direction.

The columnar body CL includes a third region (connection part) having a large width in the X-direction on the substrate 10 side of the first widened part a adjacent to the first widened part a. The third region faces to the insulating layer 40a at the interface between the lower layer stacked body 120 and the upper layer stacked body 140. The width of the third region of the columnar body CL in the X-direction is substantially the same as the width of the first widened part a in the X-direction. The width of the third region of the columnar body CL in the X-direction is larger than the width of the second region facing the conductive layers 70 of the upper layer stacked body 140 in the X-direction. The width of the third region of the columnar body CL in the X-direction is larger than the width of the first region facing the conductive layers 70 of the lower layer stacked body 120 in the X-direction.

The columnar body CL includes a second widened part b having a large width in the X-direction on the substrate 10 side of the third region adjacent to the third region. The second widened part b is arranged adjacent to the third region and opposite to the first widened part a. The second widened part b faces to the insulating layer 40a at the interface between the lower layer stacked body 120 and the upper layer stacked body 140. The width of the second widened part b of the columnar body CL in the X-direction is substantially the same as the width of the third region in the X-direction. The columnar body CL, the width of the second widened part b in the X-direction is larger than the width of the second region facing the conductive layers 70 of the upper layer stacked body 140 in the X-direction. The width of the second widened part b of the columnar body CL in the X-direction is larger than the width of the first region facing the conductive layers 70 of the lower layer stacked body 120 in the X-direction.

The columnar body CL includes a second narrowed part B having a smaller width in the X-direction on the substrate 10 side of third region adjacent to the second widened part b. A second narrowed part B adjacent to the first region facing the conductive layers 70 of the lower layer stacked body 120. The second narrowed part B faces to the insulating layer 40a at the interface between the lower layer stacked body 120 and the upper layer stacked body 140. The width of the second narrowed part B of the columnar body CL in the X-direction is smaller than the width of third region in the X-direction. The width of the second narrowed part B of the columnar body CL in the X-direction may be larger than the width of the second region facing the conductive layers 70 of the upper layer stacked body 140 in the X-direction. The width of the second narrowed part B of the columnar body CL in the X-direction may be larger than the width of the first region facing the conductive layers 70 of the lower layer stacked body 120 in the X-direction.

The memory layer 30 is arranged in a cylindrical shape at the side surface of the columnar body CL. The outer surface of the memory layer 30 (the surface in contact with the conductive layers 70 and the insulating layers 40 that are alternately stacked) reflects the shapes of the side surface of the columnar body CL as described above. The inner surface of the memory layer 30 (the surface in contact with the semiconductor layer 20) also reflects the shapes of the side surface of the columnar body CL as described above. That is, the memory layer 30 includes the first narrowed part A having a small outer width (outer diameter, distance between the opposing outer surfaces) in the X-direction at the interface between the lower layer stacked body 120 and the upper layer stacked body 140. The memory layer 30 includes the first widened part a having a large outer width in the X-direction at the interface between the lower layer stacked body 120 and the upper layer stacked body 140. The memory layer 30 includes the third region having a large outer width in the X-direction adjacent to the first widened part a on the substrate 10 side of the first widened part a. The memory layer 30 includes the second widened part b having a large outer width in the X-direction adjacent to the third region on the substrate 10 side of the third region. The memory layer 30 includes the second narrowed part B having a small outer width in the X-direction adjacent to the second widened part b on the substrate 10 side of the third region. Since the magnitude relationship of the outer width of the first widened part a, the second widened part b, the first narrowed part A, the second narrowed part B, the first region, the second region, and the third region of the memory layer 30 in the X-direction is same as the magnitude relationship of the width of the first widened part a, the second widened part b, the first narrowed part A, the second narrowed part B, the first region, the second region, and the third region of the columnar body CL in the X-direction, the description thereof is omitted here.

The shortest distance (film thickness) between the outer surface of the memory layer 30 (the surface in contact with the conductive layers 70 and the insulating layers 40 that are alternately stacked) and the inner surface of the memory layer 30 (the surface in contact with the semiconductor layer 20) is substantially the same over the entire surface. That is, the film thickness of the memory layer 30 is formed to have a substantially uniform thickness regardless of the shapes of the opening MH and the columnar body CL.

The semiconductor layer 20 is arranged in a bottomed cylindrical shape so as to contact with the inner surface of the memory layer 30 and the epitaxial grown layer 60. The outer surface of the semiconductor layer 20 (the surface in contact with the memory layer 30) reflects the shapes of the side surface of the columnar body CL as described above. The inner surface of the semiconductor layer 20 (the surface in contact with the core layer 50) also reflects the shape of the side surface of the columnar body CL as described above. That is, the semiconductor layer 20 includes the first narrowed part A having a small outer width (outer diameter, the distance between the opposing outer surface) in the X-direction at the interface between the lower layer stacked body 120 and the upper layer stacked body 140. The semiconductor layer 20 includes the first widened part a having a large outer width in the X-direction at the interface between the lower layer stacked body 120 and the upper layer stacked body 140. The semiconductor layer 20 includes the third region having a large outer width in the X-direction adjacent to the first widened part a on the substrate 10 side of the first widened part a. The semiconductor layer 20 has the second widened part b includes a large outer width in the X-direction adjacent to the third region on the substrate 10 side of the third region. The semiconductor layer 20 has the second narrowed part B having a small outer width in the X-direction adjacent to the second widened part b on the substrate 10 side of the third region. Since the magnitude relationship of the outer width of the first widened part a, the second widened part b, the first narrowed part A, the second narrowed part B, the first region, the second region, and the third region of the semiconductor 20 in the X-direction is same as a magnitude relationship of the widths of the first widened part a, the second widened part b, the first narrowed part A, the second narrowed part B, the first region, the second region and the third region of the columnar body CL in the X-direction, the description thereof is omitted here.

The shortest distances (film thicknesses) between the outer surface of the semiconductor layer 20 (the surface in contact with the memory layer 30) and the inner surface of the semiconductor layer 20 (the surface in contact with the core layer 50) is different in the first widened part a, the second widened part b, the first narrowed part A, the second narrowed part B, the first region, the second region, and the third region. The film thickness of the semiconductor layer 20 in the first region and the second region is smaller than the film thickness of the semiconductor layer 20 in the first widened part a, the second widened part b, the first narrowed part A, the second narrowed part B, and the third region. The minimum film thickness of the semiconductor layer 20 in the first widened part a, the second widened part b, the first narrowed part A, the second narrowed part B, and the third region may be larger than the film thickness of the semiconductor layer 20 in the first region and the second region. The smaller film thickness of the semiconductor layer 20 in the first region and the second region allows the semiconductor layer 20 to improve the characteristics of a memory cell MC configured with the opposing memory layer 30 and the conductive layer 70. Since the film thickness of the semiconductor layer 20 in the first widened part a, the second widened part b, the first narrowed part A, the second narrowed part B, and the third region is large, discontinuity of the semiconductor layer 20 can be suppressed, and reliability and manufacturing yield can be improved.

In this embodiment, it is shown as an example that the film thickness of the semiconductor layer 20 facing all the conductive layers 70 in the first region and the second region is smaller than the film thickness of the semiconductor layer 20 in the first widened part a, the second widened part b, the first narrowed part A, the second narrowed part B, and the third region. However, the present embodiment is not limited to this, and the thickness of the semiconductor layer 20 facing the conductive layer 70 on the top layer of the first region and/or the conductive layer 70 on the bottom layer of the second region proximate to the third region may be substantially the same as the thickness of the semiconductor layer 20 in the third region, as will be described in the following modified examples.

The core layer 50 is arranged in a cylindrical shape so as to contact with the inner surface of the semiconductor layer 20. The outer surface of the core layer 50 (the surface in contact with the semiconductor layer 20) reflects the shape of the side surface of the columnar body CL as described above. That is, the core layer 50 includes the first narrowed part A having a small outer width (outer diameter, distance between the opposing outer surfaces) in the X-direction at the interface between the lower layer stacked body 120 and the upper layer stacked body 140. The core layer 50 includes the first widened part a having a large outer width in the X-direction at the interface between the lower layer stacked body 120 and the upper layer stacked body 140. The core layer 50 includes the third region having a large outer width in the X-direction adjacent to the first widened part a on the substrate 10 side of the first widened part a. The core layer 50 includes the second widened part b having a large outer width in the X-direction adjacent to the third region on the substrate 10 side of the third region. The core layer 50 includes the second narrowed part B having a small outer width in the X-direction adjacent to the second widened part b on the substrate 10 side of the third region. Since the magnitude relationship of the width of the first widened part a, the second widened part b, the first narrowed part A, the second narrowed part B, the first region, the second region, and the third region of the core layer 50 in the X-direction is same as the magnitude relationship of the width in the first widened part a, the second widened part b, the first narrowed part A, the second narrowed part B, the first region, the second region, and the third region of the columnar body CL in the X-direction, the description thereof is omitted here.

The insulating layer 40 is arranged on the top layer of the conductive layer 70, and the insulating layer 41 is arranged on the insulating layer 40.

Figure 3:
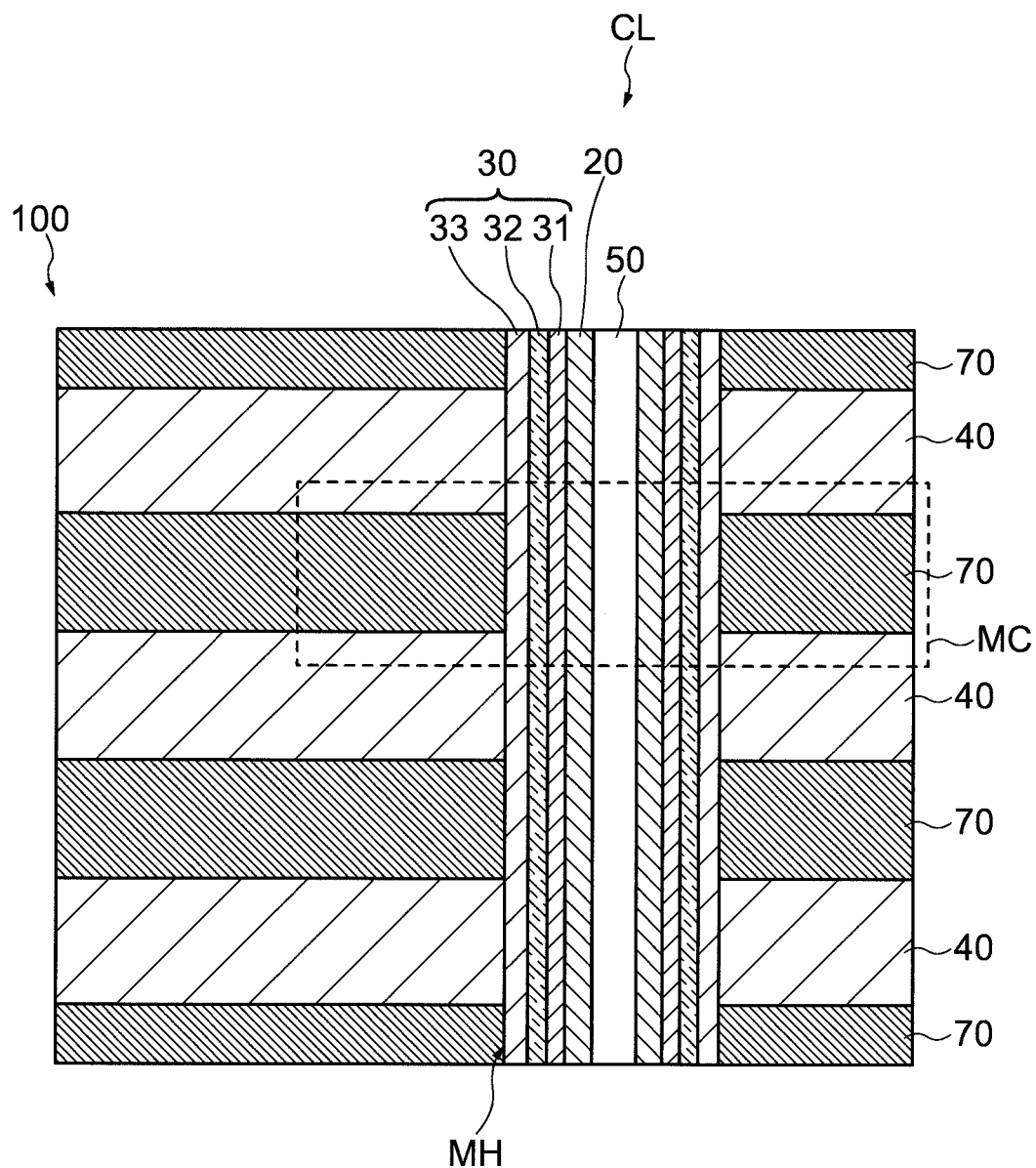
FIG. 3 is a cross-sectional view showing a configuration of a memory cell of a semiconductor memory device according to one embodiment.

FIG. 3 is an enlarged cross-sectional view of a part of FIG. 2.

The columnar body CL is a structure including the memory layer 30, the semiconductor layer 20, and the insulating core layer 50. The semiconductor layer 20 extends continuously in the stacking direction in the stacked body 100. The material of the semiconductor layer 20 include, for example, amorphous or polycrystalline silicon. The core layer 50 is arranged inside the cylindrical semiconductor layer 20. The material of the core layer 50 includes, for example, silicon oxide. The memory layer 30 is arranged between the conductive layers 70 and the semiconductor layer 20. The memory layer 30 surrounds the semiconductor layer 20 from the outer periphery side of the semiconductor layer 20.

The memory layer 30 includes a tunnel insulating layer 31, the charge storage layer 32, and a block insulating layer 33 (here, referred to as the memory layer 30 when the tunnel insulating layer 31, the charge storage layer 32, and the block insulating layer 33 are not distinguished from each other). The block insulating layer 33, the charge storage layer 32, the tunnel insulating layer 31 extend continuously in the stacking direction of the stacked body 100 with the semiconductor layer 20. The block insulating layer 33, the charge storage layer 32, and the tunnel insulating layer 31 are arranged between the conductive layer 70 and the semiconductor layer 20, in this order from the conductive layers 70 side. The tunnel insulating layer 31 is in contact with the semiconductor layer 20. The block insulating layer 33 is in contact with the conductive layers 70. The charge storage layer 32 is arranged between the block insulating layer 33 and the tunnel insulating layer 31.

The semiconductor layers 20, the memory layers 30, and the conductive layers 70 constitute the memory cells MC. In FIG. 3, one memory cell MC is schematically represented by a broken line. The memory cell MC has a vertical transistor structure surrounded by the conductive layer 70 around the semiconductor layer 20 through the memory layer 30.

In the memory cell MC having the vertical transistor structure, the semiconductor layer 20 functions as a channel and the conductive layer 70 functions as a control gate. The charge storage layer 32 functions as a data storage layer for storing charges injected from the semiconductor layer 20.

As described above, the plurality of memory cells MC is arranged in the stacking directions of the plurality of conductive layers 70, and the plurality of conductive layers 70 are connected to the plurality of memory cells MC, respectively. The conductive layer 70 near the block insulating layer 33 functions as a control gate. By controlling voltages to the conductive layer 70 connected to the memory cell MC, writing or erasing to or from the memory cell MC is controlled.

The semiconductor memory device of the embodiment is the non-volatile semiconductor memory device in which writing or erasing of data to or from the memory cell MC can be performed electrically freely, and stored data can be held even when power supply is turned off.

The memory cell MC is, for example, a charge trap type memory cell. The charge storage layer 32 has a number of trap sites that trap charges in the insulating layer. The material of the charge storage layer 32 includes, for example, silicon nitride.

The tunnel insulating layer 31 serves as a potential barrier when charge is injected from the semiconductor layer 20 into the charge storage layer 32, or when the charges accumulated in the charge storage layer 32 diffuses toward the semiconductor layer 20. The material of the tunnel insulating layer 31 includes, for example, silicon oxide.

The block insulating layer 33 prevents charges accumulated in the charge storage layer 32 from diffusing into conductive layer 70. The material of the block insulating layer 33 includes, for example, silicon oxide.

As shown in FIG. 1, the lower layer stacked body 120 is arranged with a source-side selecting transistor STS and a plurality of memory cells MC. The upper layer stacked body 140 is arranged with a drain-side selecting transistor STD and a plurality of memory cells MC. For example, the lowermost conductive layer 70 serves as a control gate for the source-side selecting transistor STSs. For example, the top layer of conductive layer 70 serves as a control gate for the drain-side selecting transistor STDs.

A plurality of memory cells MC is arranged between the drain-side selecting transistor STD and the source-side selecting transistor STS. The plurality of memory cells MCs, the drain-side selecting transistor STDs, and the source-side selecting transistor STSs are connected in series through the semiconductor layer 20 to constitute one memory string. The memory strings are arranged, for example, in a staggered manner in a plane direction parallel to the XY plane, and a plurality of memory cells MC are three-dimensionally arranged in the X-direction, the Y-direction, and the Z-direction.

Figure 17:
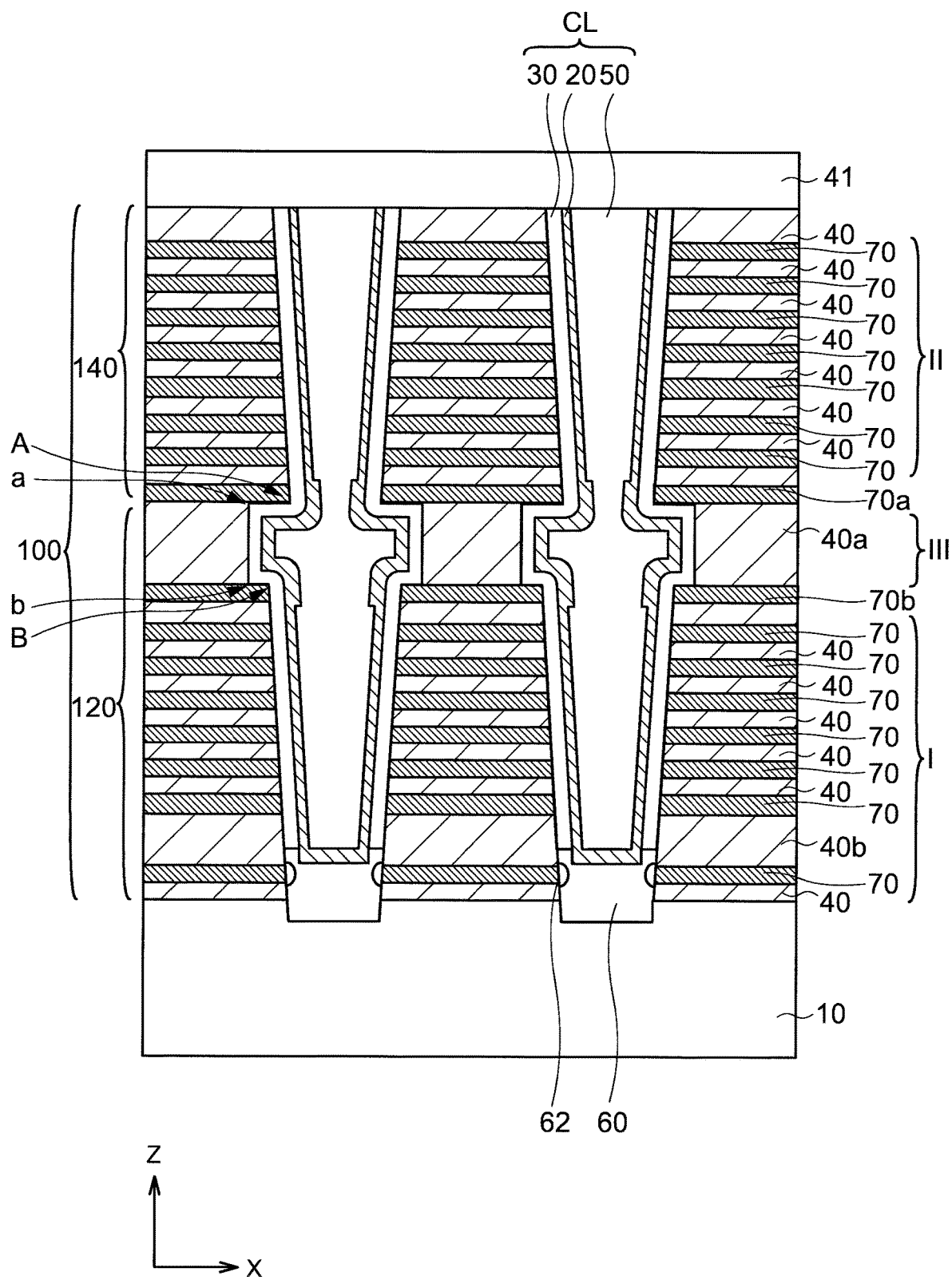
FIG. 17 is a cross-sectional view showing a configuration of a memory cell of a semiconductor memory device according to a modified example.

FIG. 17 shows a modified example in which a conductive layer 70a is arranged between the lowermost conductive layer 70 of the second region and the third region, and a conductive layer 70b is arranged between the uppermost conductive layer 70 of the first region and the third region. The memory cell array according to the present modified example is same as the memory cell array according to the first embodiment except that the memory cell array includes the conductive layer 70a and the conductive layer 70b. In the following description, a description of the same configuration and manufacturing method as those of the first embodiment will be omitted, and a description will be given mainly of a configuration different from that of the first embodiment.

In this modified example, the conductive layer 70a (third conductive layer) is arranged between the lowermost conductive layer 70 of the second region and the third region. The film thickness of the semiconductor layer 20 facing the conductive layer 70a is substantially same as the film thickness of the semiconductor layer 20 in the third region. The film thickness of the semiconductor layer 20 facing the conductive layer 70a is larger than the film thickness of the semiconductor layer 20 facing the conductive layers 70 of the first region and the conductive layers 70 of the second region. In this instance, the first narrowed part A may oppose the conductive layer 70a below the lowermost conductive layer 70 of the second region. The memory cell MC including the semiconductor layer 20 facing the conductive layer 70a may not function as the memory cell MC.

In this modified example, the conductive layer 70b is further arranged between the uppermost conductive layer 70 of the first region and the third region. The film thickness of the semiconductor layer 20 facing the conductive layer 70b is substantially the same as the film thickness of the semiconductor layer 20 in the third region. The film thickness of the semiconductor layer 20 facing the conductive layer 70b is larger than the film thickness of the semiconductor layer 20 facing the conductive layers 70 of the first region and the conductive layers 70 of the second region. In this instance, the second narrowed part B may oppose the conductive layer 70b on the uppermost conductive layer 70 of the first region. The memory cell MC including the semiconductor layer 20 facing the conductive layer 70b may not function as the memory cell MC. The memory cell array according to the present modified example shows a configuration including the conductive layer 70a and the conductive layer 70b. However, it is not limited thereto, it may be configured to include only one of the conductive layers 70a and the conductive layer 70b.

[Method of Manufacturing Memory Cell Array]

Next, a method of manufacturing the memory cell array 1 of the first embodiment will be described with reference to FIGS. 4 to 15.

Figure 4:
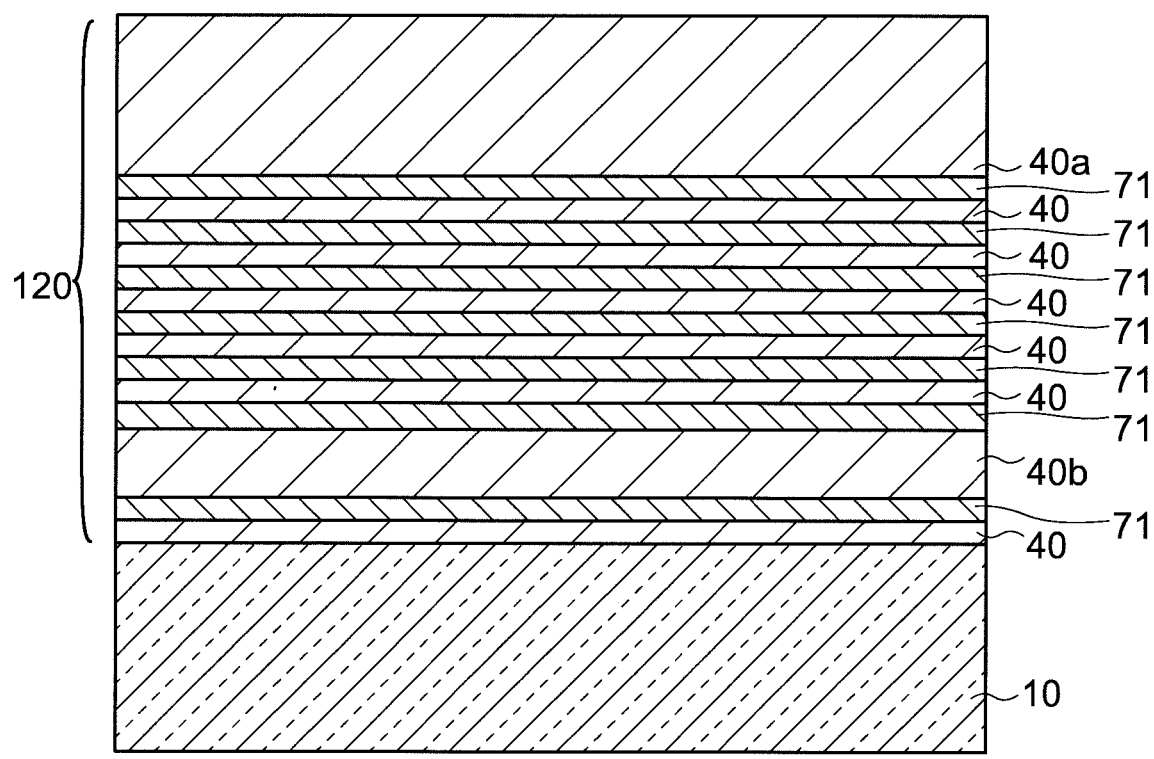
FIG. 4 is a cross-sectional view showing a method of manufacturing a semiconductor memory device according to one embodiment.

As shown in FIG. 4, first, the insulating layer 40 (TEOS film) and the sacrificing layer 71 (SiN film) are alternately formed on the substrate 10 to form the lower layer stacked body 120. The insulating layer 40 and the sacrificing layer 71 are deposited using, for example, CVD apparatus. The insulating layer 40 and the sacrificing layer 71 that stacked alternately are formed in contact with each other. The film thickness of the insulating layer 40a formed on the uppermost layer of the lower layer stacked body 120 in the stacking direction may be larger than the film thickness of the underlying insulating layers 40 in the stacking direction. The film thickness of the insulating layer 40a formed on the uppermost layer of the lower layer stacked body 120 in the stacking direction may be, for example, larger than the film thickness of the insulating layer 40b on the lowermost sacrificing layer 71 in the stacking direction. In this embodiment, the material of the insulating layer 40 is exemplified as a TEOS film, but the material of the insulating layer 40 is not limited thereto and may be, for example, silicon dioxide ($SiO_2$). In the present embodiment, the material of the sacrificing layer 71 is exemplified by a silicon nitride film (SiN), but the material of the sacrificing layer 71 is not limited to this, and may be, for example, silicon.

Figure 5:
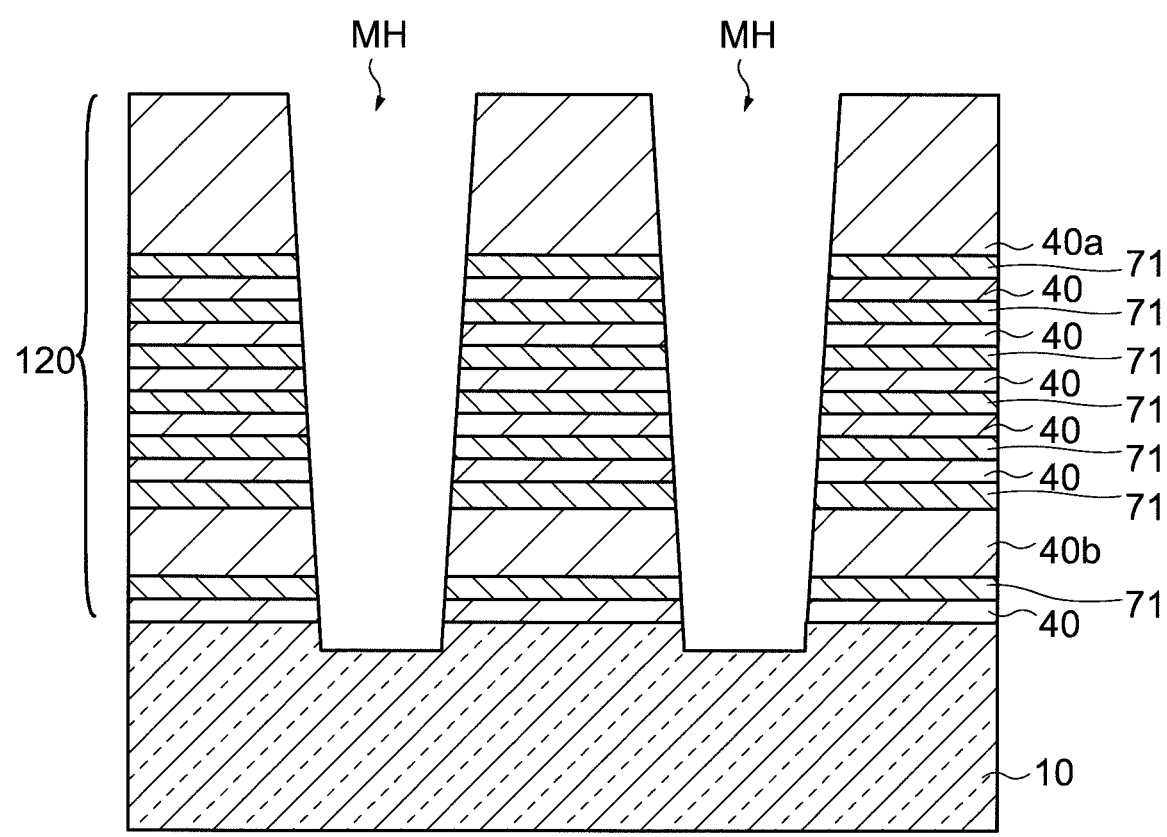
FIG. 5 is a cross-sectional view showing a method of manufacturing a semiconductor memory device according to one embodiment.

Next, as shown in FIG. 5, a plurality of memory holes MHs is formed in the lower layer stacked body 120 including the plurality of insulating layers 40 and the plurality of sacrificing layers 71. The memory holes MHs are formed by RIE (Reactive Ion Etching) using mask (not shown). The memory holes MHs penetrate the lower layer stacked body 120 in the stacking direction, and exposing the substrate 10 at the bottom part of the memory holes MHs.

Figure 6:
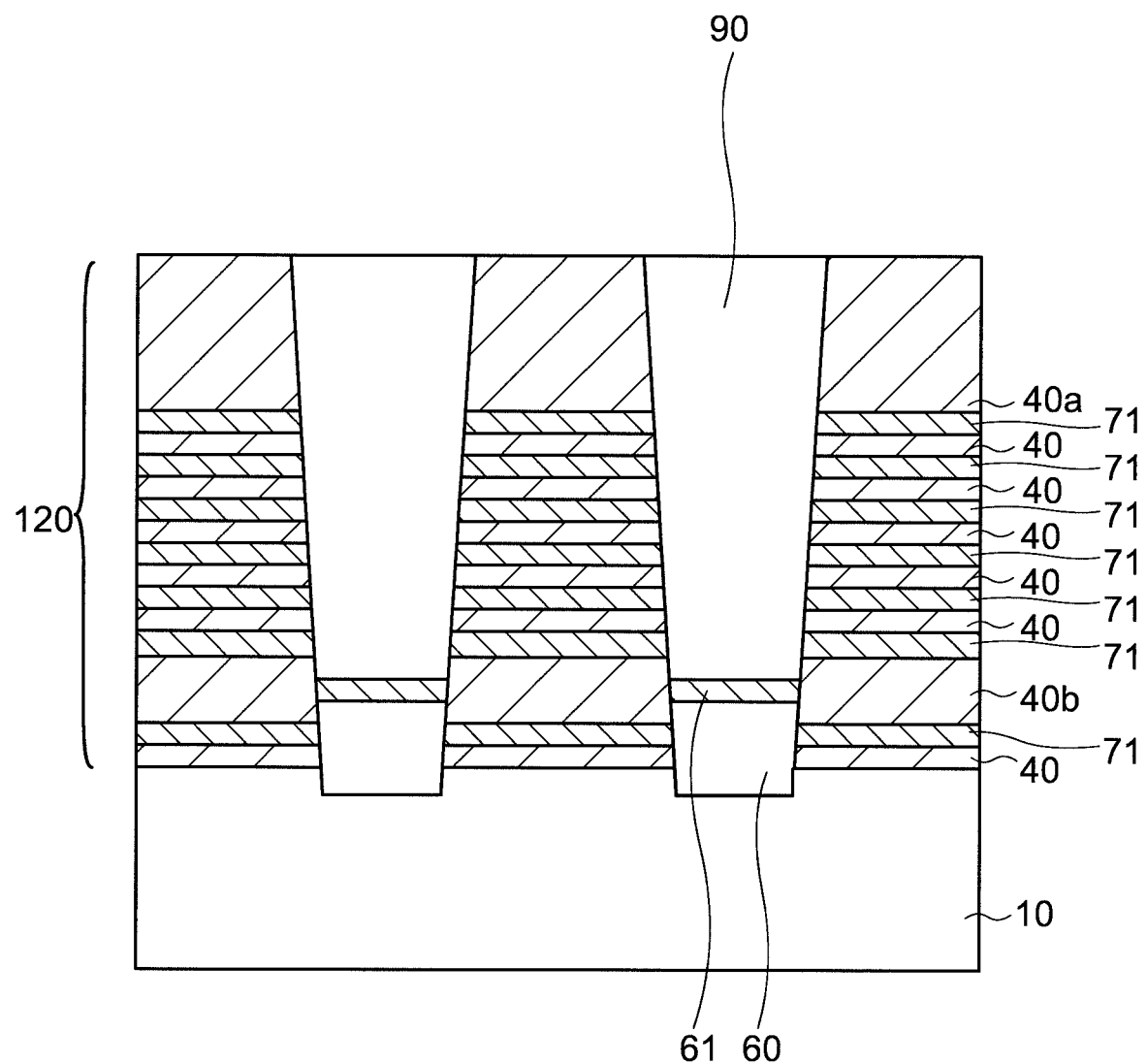
FIG. 6 is a cross-sectional view showing a method of manufacturing a semiconductor memory device according to one embodiment.

As shown in FIG. 6, the substrate 10 exposed inside the memory hole MH is used as a seed crystal to perform epitaxial growth of the silicon single crystal. Epitaxial growth of the silicon single crystal is also performed using the CVD apparatus to form an epitaxial growth layer 60. Subsequently, the surface of the epitaxial growth layer 60 is oxidized (for example, thermally oxidation). A silicon oxide film 61 is formed on the surface of the epitaxial growth layer 60. A sacrificing film 90 is formed on the silicon oxide film 61 of the memory hole MH. The material of the sacrificing film 90 may be, for example, amorphous silicon. The sacrificing film 90 is one which is filled to form the upper layer stacked body 140 and is scheduled to be removed later.

Figure 7:
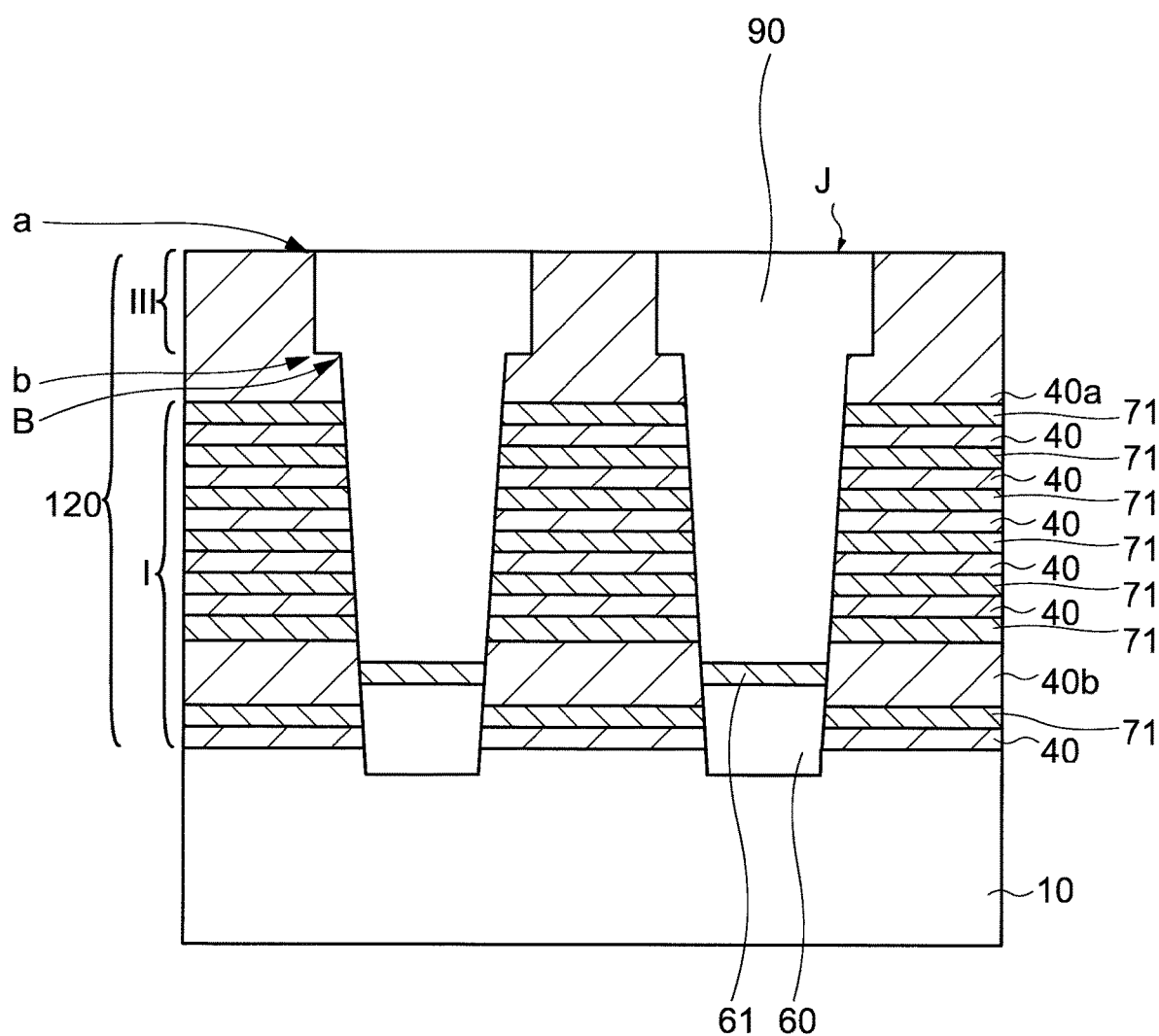
FIG. 7 is a cross-sectional view showing a method of manufacturing a semiconductor memory device according to one embodiment.

Next, for example, as shown in FIG. 7, by removing a part of the insulating layer 40 and widen the width (inner diameter, the distance between the opposing inner surfaces) of the upper end part of the memory hole MH of the lower layer stacked body 120 to form a joint part J. The joint part J is formed by, for example, a method such as wet etching or the like. The joint part J is formed in the insulating layer 40a formed as the uppermost layer of the lower layer stacked body 120. That is, the joint part J is formed above the first region facing the sacrificing layers 71 of the lower layer stacked body 120. As a result, the memory hole MH is formed with the third region having larger width in the X-direction than that of the first region. The second widened part b is formed on the side of the substrate 10 of the third region adjacent to the third region, and the first widened part a is formed on the side opposed to the substrate 10 of third region adjacent to the third region. The second narrowed part B having a width smaller than the third region in the X-direction is formed on the substrate 10 side of the third region adjacent to the second widened part b. The sacrificing film 90 is also formed at the joint part J of the memory hole MH.

Figure 8:
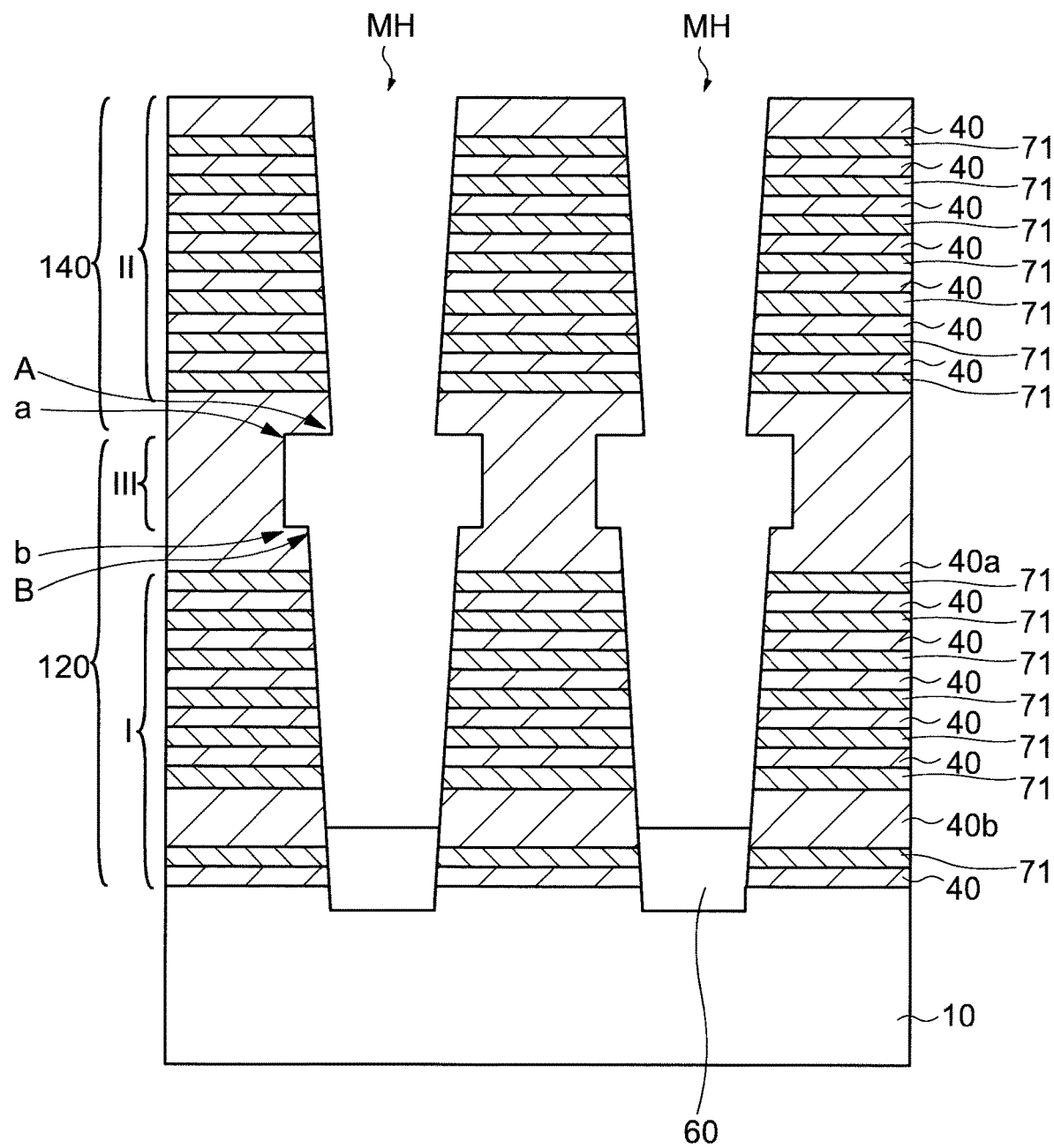
FIG. 8 is a cross-sectional view showing a method of manufacturing a semiconductor memory device according to one embodiment.

Next, as shown in FIG. 8, the upper layer stacked body 140 is formed by alternately forming the insulating layers 40 (TEOS film) and the sacrificing layers 71 (SiN film) on the lower layer stacked body 120. The insulating layers 40 and sacrificing layers 71 are deposited using, for example, CVD apparatus. The insulating layers 40 and the sacrificing layers 71 which alternately stacked are formed in contact with each other. The film thickness of the insulating layers 40 formed at the lowermost layer and the uppermost layer of the upper layer stacked body 140 may be larger than the film thickness of the other insulating layers 40. The film thickness of the insulating layers 40 of the upper layer stacked body 140 may be smaller than the film thickness of the insulating layer 40a formed as the uppermost layer of the lower layer stacked body 120.

Subsequently, the plurality of memory holes MHs is formed in the upper layer stacked body 140 including the plurality of insulating layers 40 and the plurality of sacrificing layers 71. The memory holes MH s are formed by RIE (Reactive Ion Etching) using mask (not shown). The memory hole MH of the upper layer stacked body 140 is formed to be connected to the joint part J of the memory hole MH of the lower layer stacked body 120. The memory hole MH of the upper layer stacked body 140 has a smaller width (inner diameter, distance between the opposing inner surfaces) than the width of the joint part J. In the memory hole MH, the second region facing the sacrificing layers 71 of the upper layer stacked body 140 having a width in the X-direction smaller than the width in the X-direction of the third region is formed. The first narrowed part A having a width smaller than that of the third region in the X-direction is formed on the opposite side of the third region from the substrate 10, and adjacent to the third region. The memory hole MH penetrates the upper layer stacked body 140 in the stacking direction to expose the sacrificing film 90 filled in the joint part J of the memory hole MH of the lower layer stacked body 120.

The sacrificing film 90 and the silicon oxide film 61 remaining in the memory hole MH of the lower layer stacked body 120 are removed through the memory hole MH of the upper layer stacked body 140. This process is performed by, for example, wet etching, RIE, or the like. As a result, the memory hole MH communicating the lower layer stacked body 120 and the upper layer stacked body 140 is formed. The silicon oxide film 61 may not be removed.

Figure 9:
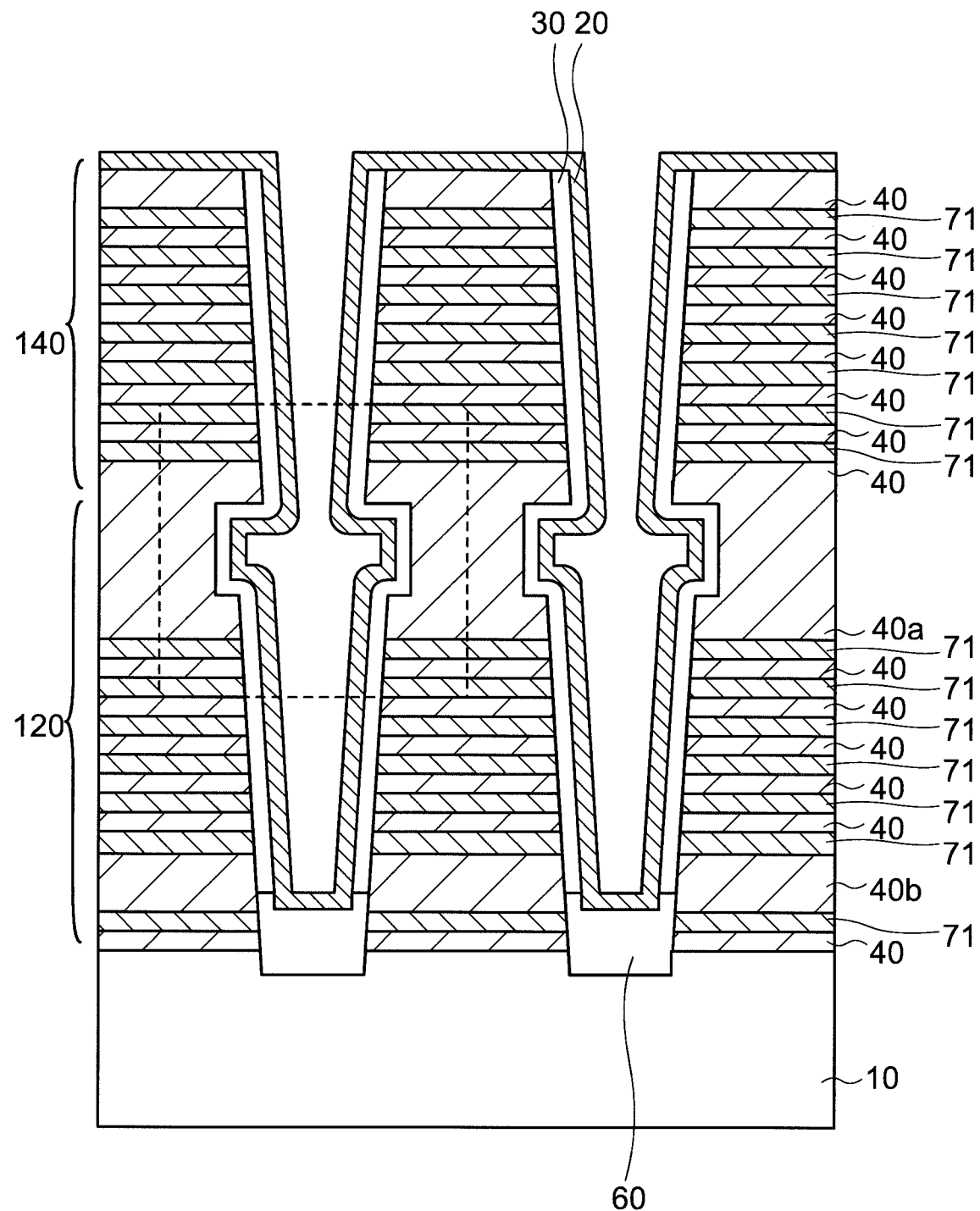
FIG. 9 is a cross-sectional view showing a method of manufacturing a semiconductor memory device according to one embodiment.

Next, as shown in FIG. 9, the memory layer 30 is formed on the side surfaces and bottom surface of the memory holes MH. The memory layer 30 is deposited on the top surface of the stacked body 100 and the inner surface (side surface and bottom surface) of the memory hole MH by using, for example, a chemical vapor deposition (CVD) apparatus.

Subsequently, the memory layer 30 on the upper surface of the stacked body 100 and the bottom surface of the memory hole MH is removed. The memory layer 30 on the upper surface of the stacked body 100 and the bottom surface of the memory hole MH is removed, for example, by the RIE method. The epitaxial growth layer 60 in the vicinity of the substrate 10 is exposed by removing the memory layer 30 on the bottom surface of the memory hole MH.

After removing the memory layer 30 on the bottom surface of the memory hole MH, the semiconductor layer 20 is formed on the side surface and the bottom surface of the memory hole MH. The semiconductor layer 20 is deposited on the upper surface of the stacked body 100 and the inner surface (side surface and bottom surface) of the memory hole MH by using, for example, the CVD apparatus. The semiconductor layer 20 is formed in contact with the side surface of the memory layer 30 and the epitaxial growth layer 60 exposed at the bottom of the memory hole MH. The semiconductor layer 20 is formed as, for example, an amorphous silicon layer, and then crystallized into a polycrystalline silicon layer by heat treatment.

Figure 10:
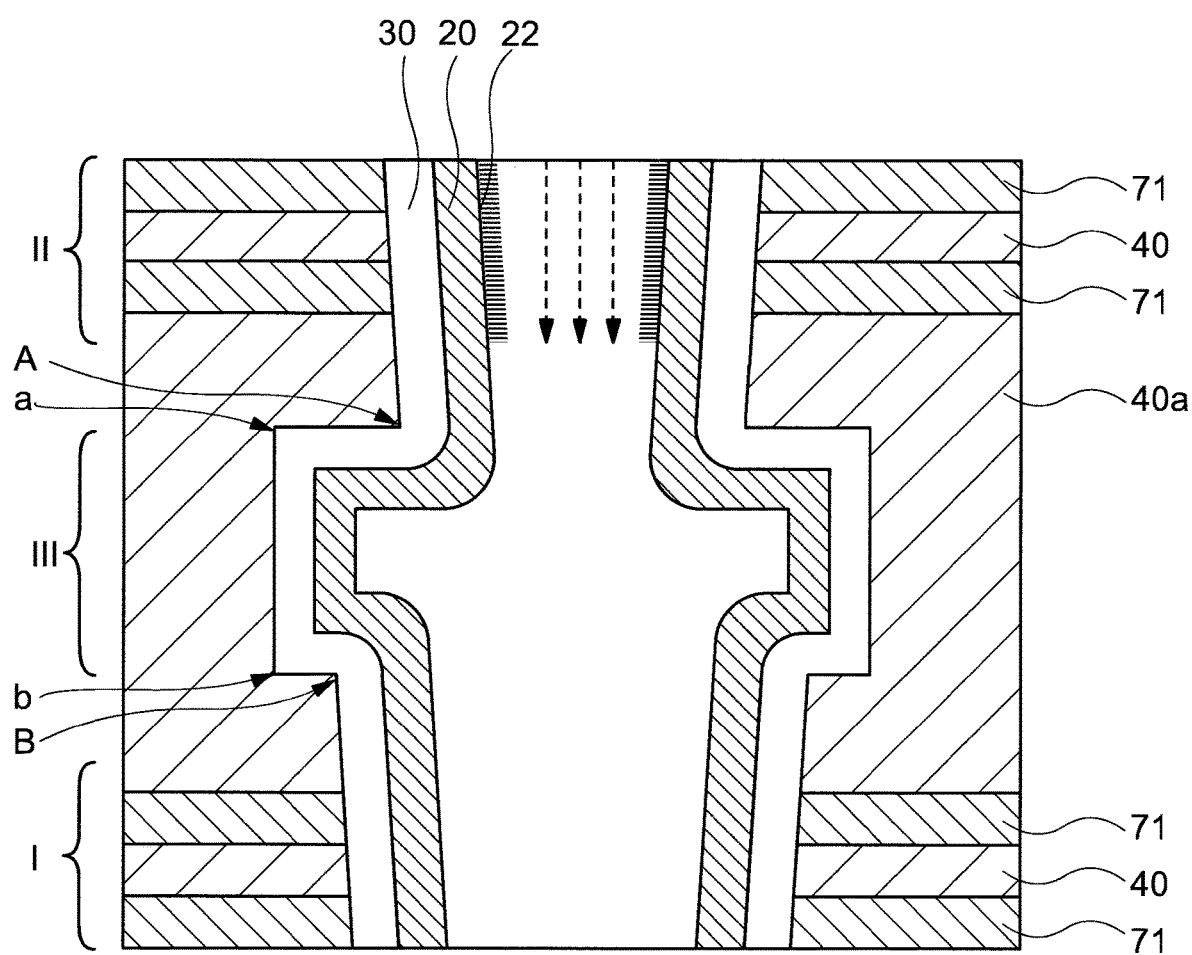
FIG. 10 is a cross-sectional view showing a method of manufacturing a semiconductor memory device according to one embodiment.
Figure 11:
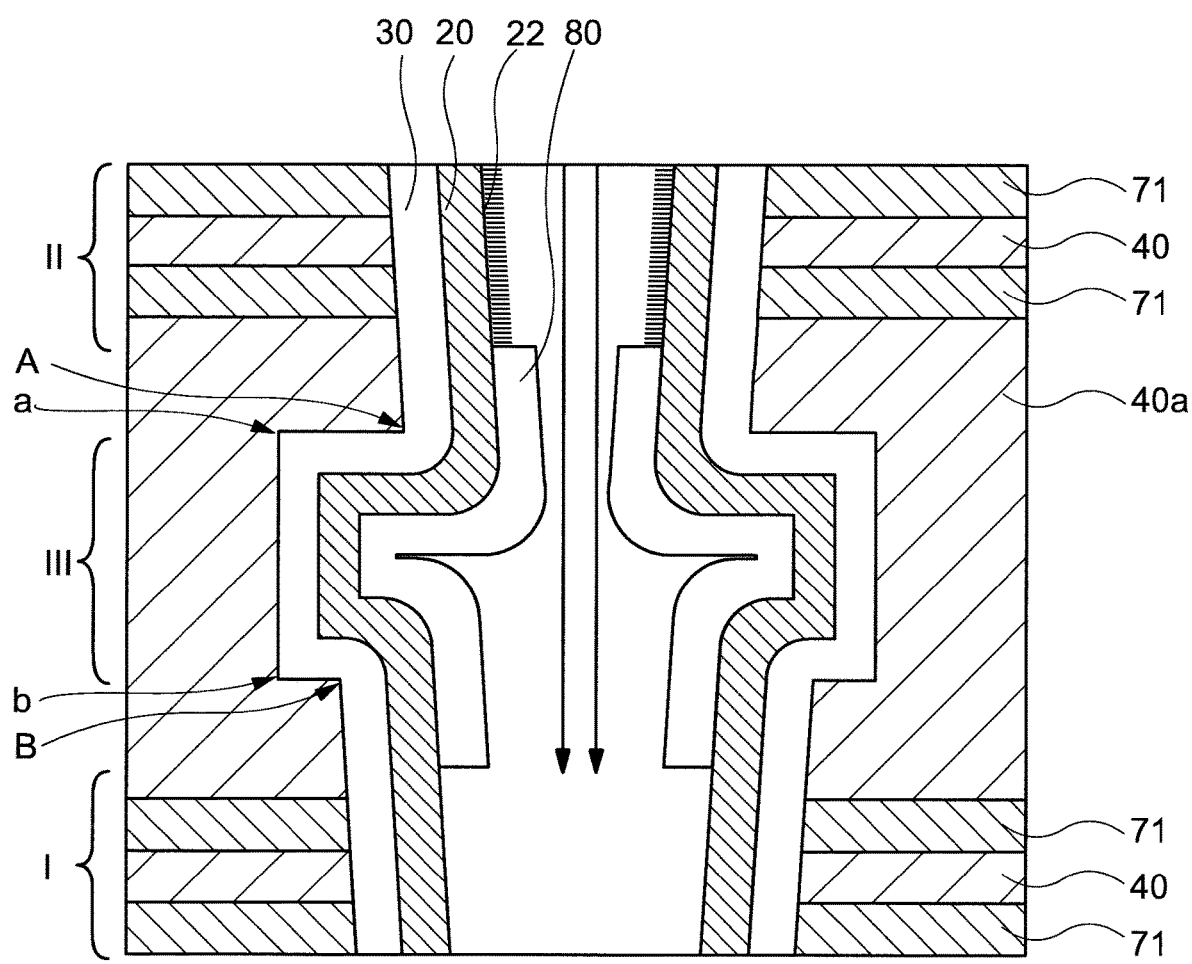
FIG. 11 is a cross-sectional view showing a method of manufacturing a semiconductor memory device according to one embodiment.

FIGS. 10 to 13 are enlarged cross-sectional view near the joint part J of the memory hole MH (dotted line region in FIG. 9). Next, as shown in FIGS. 10 and 11, a protective film 80 is formed on the joint part J of the memory hole MH.

As shown in FIG. 10, a plasma treatment is performed on the second region of the memory hole MH facing the sacrificing layers 71 of the upper layer stacked body 140 from the upper end of the memory hole MH. A passivation 22 is formed on the inner wall of the semiconductor layer 20 of the second region by plasma treatment. By controlling the gas type, ratio, and flow rates of the plasma treated, passivation is not formed on the inner walls of the semiconductor layer 20 of the third region and the first region. That is, the gradient of the passivation is formed in the stacking direction of the semiconductor layer 20. It is preferred to use at least one of the gas selected from the group consisting of $N_2$, Ar, He, $H_2$, $NH_3$, or F for the plasma treatment.

As shown in FIG. 11, a film forming process is performed from the upper end to the second and the third region of the memory hole MH. The film forming process is performed by supplying reactant gases from the upper end to the second and the third region of the memory hole MH. The gas type, ratio, and flow rate of the reactant gas are controlled so that the protective film can be selectively formed in the second and the third region. The protective film 80 is formed on the inner wall of the semiconductor layer 20 of the third region, the first widened part a, the second widened part b, the first narrowed part A, and the second narrowed part B, by performing a film forming process. The protective film 80 may be, for example, silicon oxide or silicon nitride. The protective film 80 is deposited by using, for example, the CVD apparatus. Since the passivation 22 is formed on the semiconductor layer 20 of the second region, nucleation of the protective film 80 is suppressed. Therefore, the protective film 80 is not formed on the semiconductor layer 20 of the second region. By controlling the gas type, ratio, and flow rate of CVD, no reactant gas is supplied to the first region. The protective film 80 is not formed on the semiconductor layer 20 of the first region due to the lack of the reactive gas. In other words, the protective film 80 is selectively formed on the inner wall of the semiconductor layer 20 of a predetermined region including the third region, the first widened part a, the second widened part b, the first narrowed part A, and the second narrowed part B (region other than the first region and the second region).

In the method of manufacturing the memory cell array according to the present embodiment, the protective film 80 can be formed on the predetermined region including the third region, the first widened part a, the second widened part b, the first narrowed part A, and the second narrowed part B (region other than the first region and the second region) by controlling the gas type, ratio, and flow rate of the plasma treatment and the CVD to suppress the film formation in the first and the second region.

FIG. 11 shows a configuration in which the protective film 80 is formed to have a substantially uniform thickness. However, the film thickness of the protective film 80 is not limited thereto, and may be formed thinner as it is closer to the first and the second region.

Figure 12:
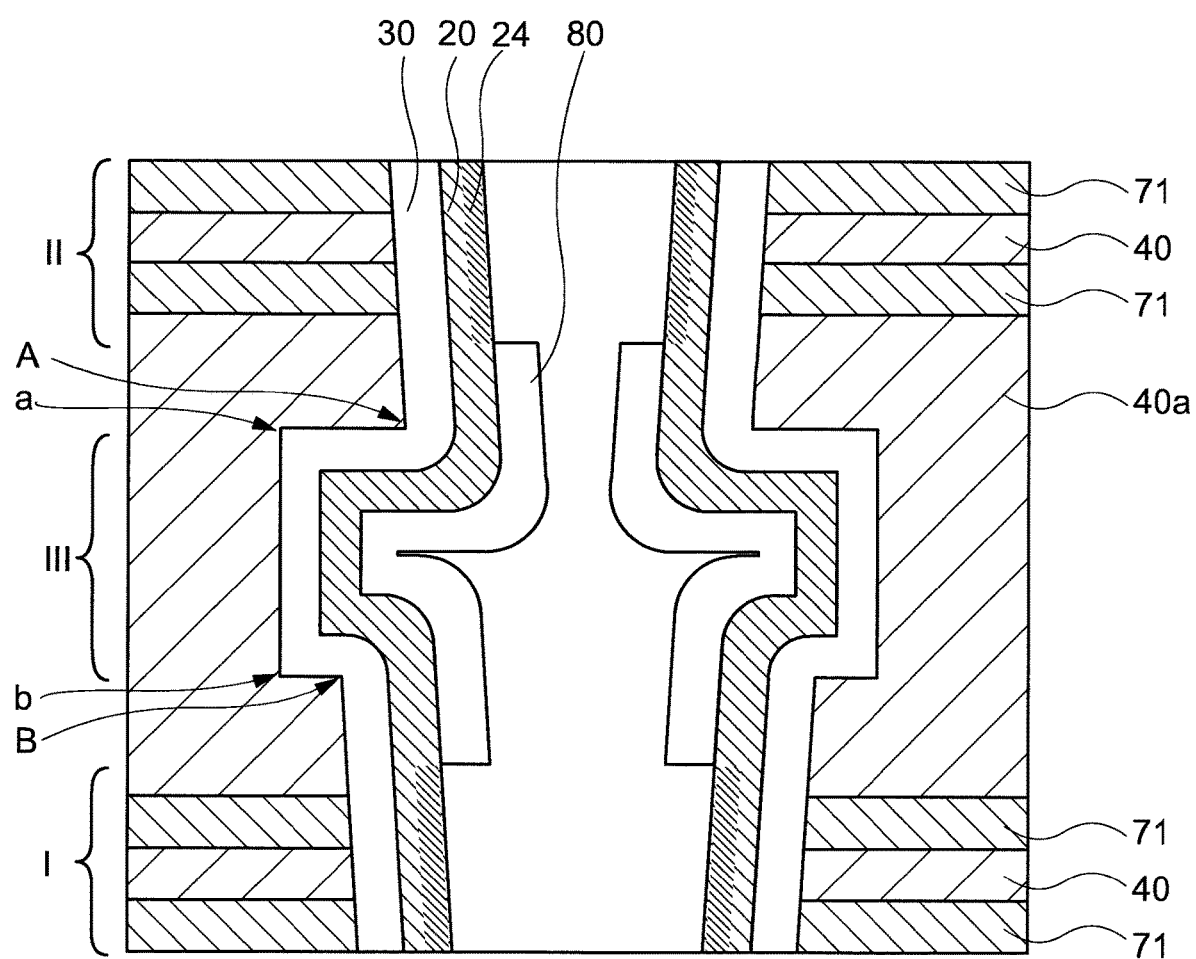
FIG. 12 is a cross-sectional view showing a method of manufacturing a semiconductor memory device according to one embodiment.

Next, as shown in FIG. 12, a part of the semiconductor layer 20 is oxidized to form an oxide film 24. The oxide film 24 is formed, for example, by an oxidation treatment or the like. The oxide film 24 is not formed on the semiconductor layer 20 of a region covered with the protective film 80 including the third region, the first widened part a, the second widened part b, the first narrowed part A, and the second narrowed part B. Therefore, the oxide film 24 is formed on the surfaces of the semiconductor layer 20 in the first region and the second region exposed from the protective film 80.

Figure 13:
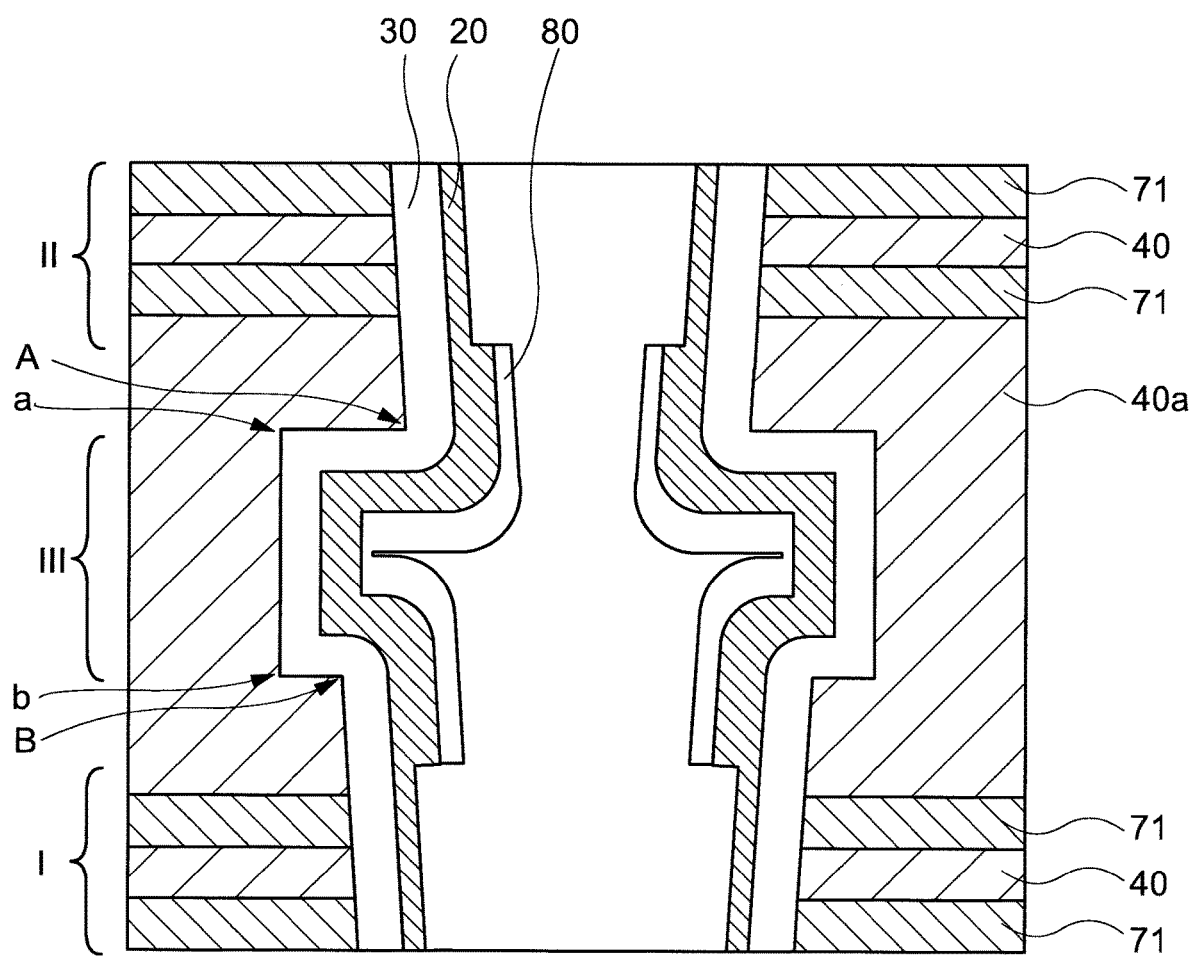
FIG. 13 is a cross-sectional view showing a method of manufacturing a semiconductor memory device according to one embodiment.

Next, as shown in FIG. 13, the oxide film 24 which was a part of the inner wall of the semiconductor layer is selectively removed. The oxide film 24 is removed by, for example, wet etching or the like. Etching is performed under conditions that the selection ratio of the oxide film 24 is higher than the selection ratio of the semiconductor layer 20. By etching the oxide film 24, the film thickness of the semiconductor layer 20 of the first region and the second region becomes smaller than the film thickness of the semiconductor layer 20 of a region including the third region, the first widened part a, the second widened part b, the first narrowed part A, and the second narrowed part B which are covered with the protective film 80. In FIG. 13, the protective film 80 is partially etched and remains. However, the present embodiment is not limited thereto, and the protective film 80 may be all etched together with the oxide film 24.

In the method of manufacturing the memory cell array according to the present embodiment, since the semiconductor layer 20 of the predetermined region including the third region (region other than the first region and second region) is covered with the protective film 80, it is possible to suppress the formation and etching of the oxide film 24 in the predetermined region including the third region (region other than the first region and the second region). Therefore, the film thickness of the semiconductor layer 20 of the predetermined region including the third region is formed to be larger than a film thickness of the semiconductor layer 20 of the first and the second region. The smaller film thickness of the semiconductor layer 20 in the first region and the second region allows the semiconductor layer 20 to improve the characteristics of the memory cell MC configured with the opposing memory layer 30 and the conductive layer 70. Since the film thickness of the semiconductor layer 20 in the predetermined region including the third region (region other than the first region and the second region) is large, discontinuity of the semiconductor layer 20 in the first narrowed part A and the second narrowed part B can be suppressed, and reliability and manufacturing yield can be improved.

Figure 14:
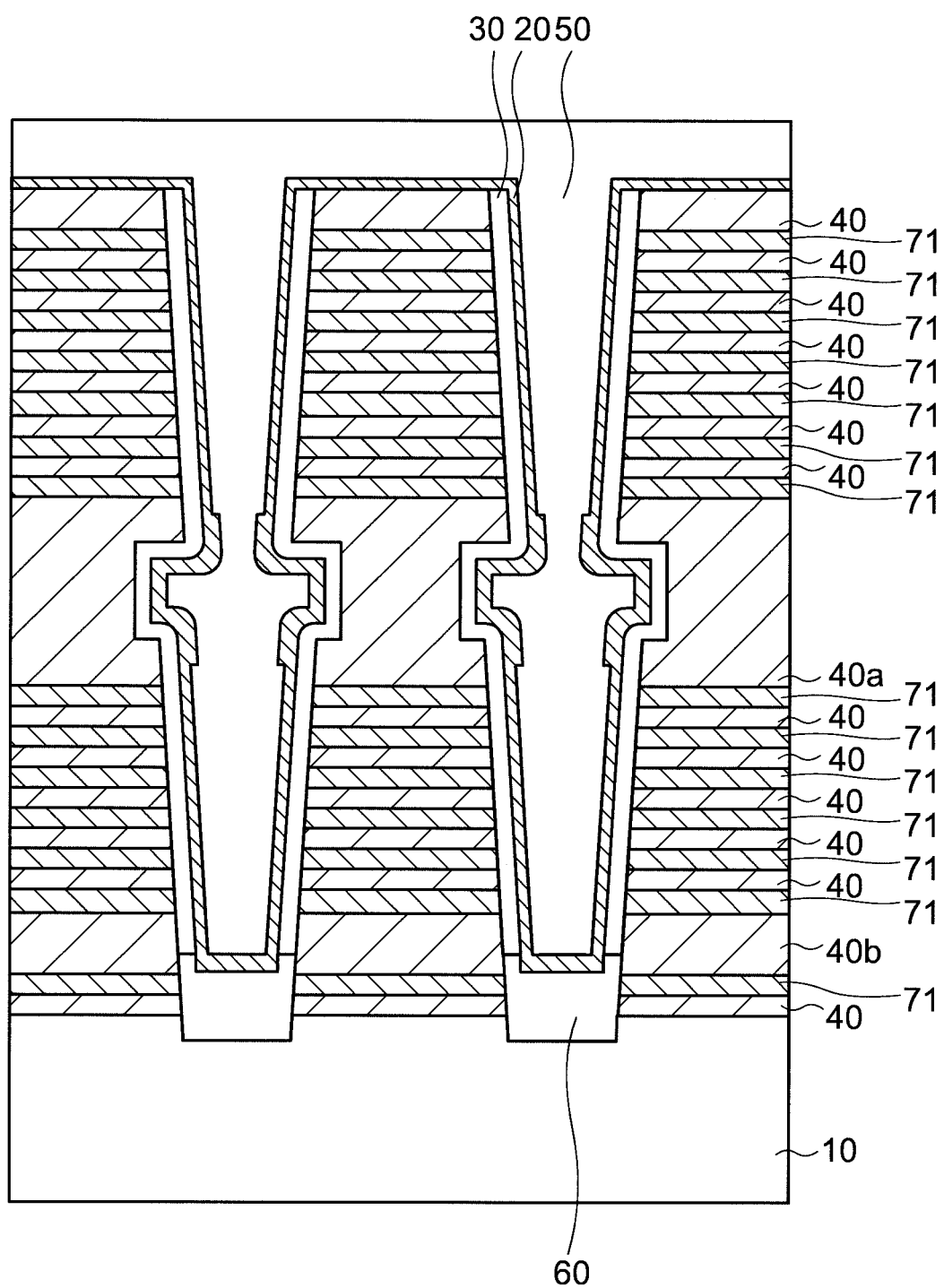
FIG. 14 is a cross-sectional view showing a method of manufacturing a semiconductor memory device according to one embodiment.

As shown in FIG. 14, the core layer 50 is formed inside the memory hole MH. The core layer 50 is formed to fill the inner side of the semiconductor layer 20. The formation of the core layer 50 is performed by using, for example, a CVD apparatus. The stack of the memory layer 30, the semiconductor layer 20, and the core layer 50 in the memory hole MH constitutes the columnar body CL.

Figure 15:
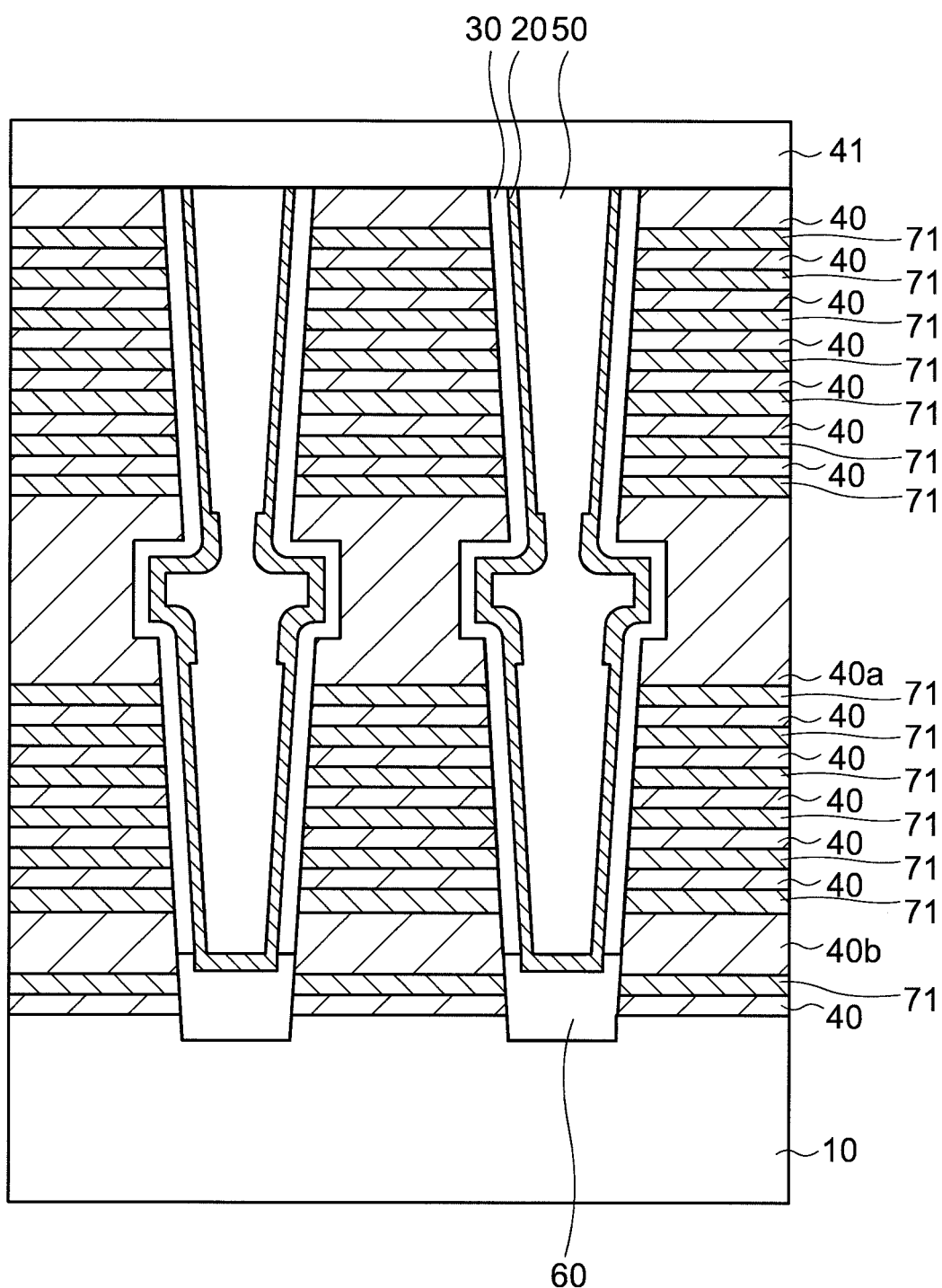
FIG. 15 is a cross-sectional view showing a method of manufacturing a semiconductor memory device according to one embodiment.

As shown in FIG. 15, the semiconductor layer 20 and the core layer 50 deposited on the stacked body 100 are removed by CMP (Chemical Mechanical Polishing) or etch-back. Thereafter, the insulating layer 41 is formed on the insulating layer 40. The insulating layer 41 covers the upper end of the stack constituting the columnar body CL.

Then, a plurality of openings STs is formed on the stacked body 100 including the insulating layer 41, the plurality of insulating layers 40, and the plurality of sacrificing layers 71 by RIE method using a mask (not shown). The opening ST is common to the plurality of insulating layers 40 and a plurality of sacrificing layers 71. The opening ST penetrates the stacked body 100 in the vicinity of the columnar body CL, and reaches the substrate 10.

Next, the sacrificing layer 71 is removed by an etchant supplied through the opening ST. Removing the sacrificing layer 71 forms a gap between the insulating layers 40 adjacent to each other in the stacking direction. An insulating layer 62 is formed on the epitaxial growth layer 60 in which the lowermost gap is exposed by performing an oxidation treatment or the like. The memory cell array 1 shown in FIG. 2 can be manufactured by forming the conductive layer 70 in the gap between the adjacent insulating layers 40.

As described above, according to the method of manufacturing the semiconductor memory device according to the present embodiment, since the film thickness of the semiconductor layer 20 in the first region and the second region is small, the semiconductor layer 20 can improve the characteristics of the memory cell MC configured together with facing memory layer 30 and the conductive layer 70. Since the film thickness of the semiconductor layer 20 in the first narrowed part A and the second narrowed part B is large, it is possible to suppress the semiconductor layer 20 from becoming discontinuous, and it is possible to improve reliability and manufacturing yield.

Second Embodiment

[Memory Cell Array Configuration]

Figure 16:
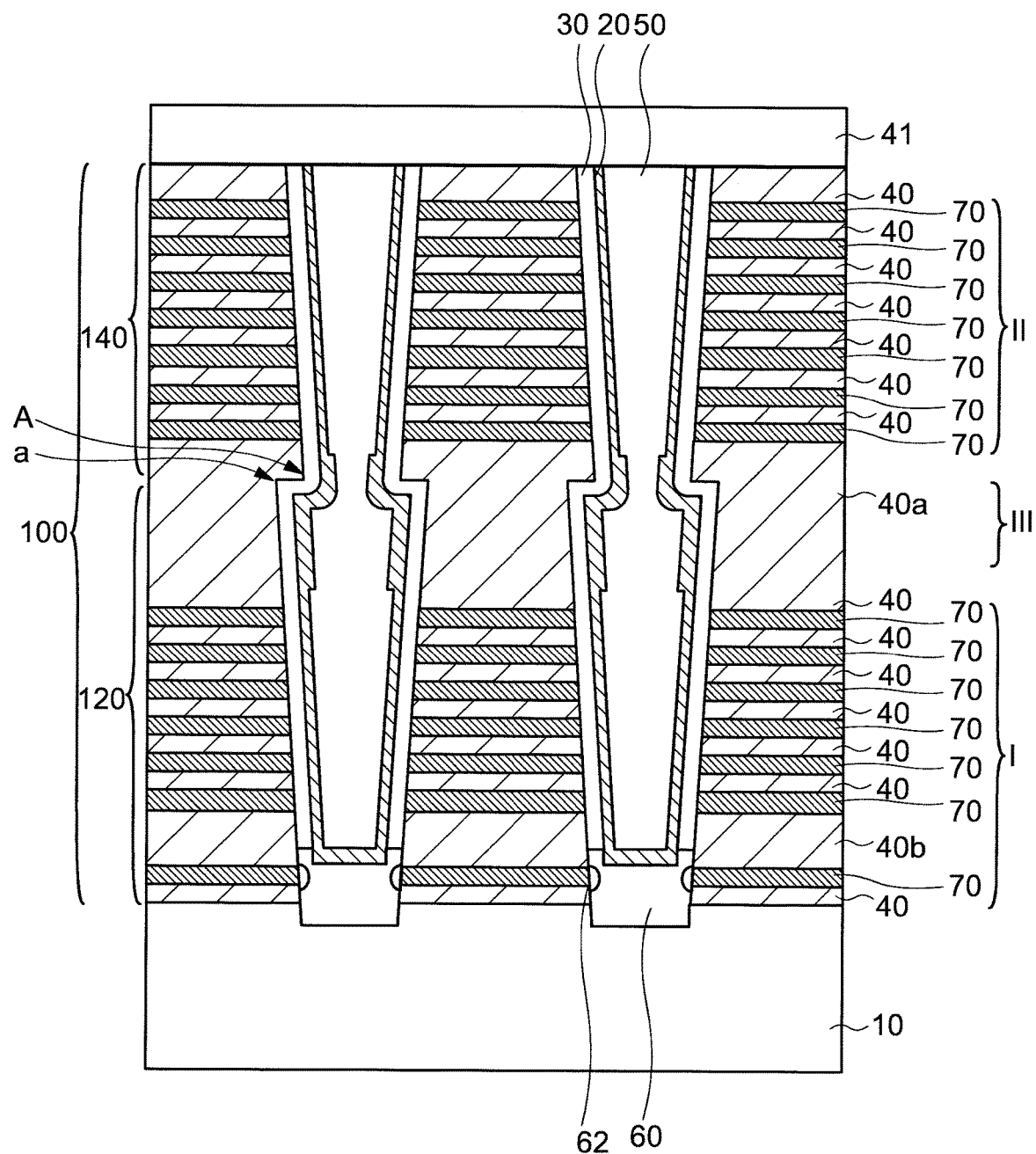
FIG. 16 is a cross-sectional view showing a configuration of a memory cell of a semiconductor memory device according to one embodiment.

With reference to FIG. 16, a memory cell array 1A according to the second embodiment and the method of manufacturing thereof will be described. The memory cell array 1A according to the second embodiment is the same as the memory cell array 1 according to the first embodiment except for the shape of the columnar body CL. In the following description, description of the same configuration and the manufacturing method as those of the first embodiment will be omitted, and a configuration and a manufacturing method different from those of the first embodiment will be mainly described.

FIG. 16 is a schematic cross-sectional view of the memory cell array 1A according to the second embodiment. As shown in FIG. 16, the columnar body CL according to the present embodiment does not have the second widened part b and a second narrowed part B.

The columnar body CL includes the first narrowed part A having a small width (diameter, distance between outer surfaces) in the X-direction at the interface between the lower layer stacked body 120 and the upper layer stacked body 140. The first narrowed part A is adjacent to the second region faces to the conductive layers 70 of the upper layer stacked body 140. The first narrowed part A faces to the insulating layer 40a at the interface between the lower layer stacked body 120 and the upper layer stacked body 140. The width of the first narrowed part A of the columnar body CL in the X-direction may be smaller than the width of the second region faces to the conductive layers 70 of the upper layer stacked body 140 in the X-direction. The width of the first narrowed part A of the columnar body CL in the X-direction may be smaller than the width of the first region faces to the conductive layers 70 of the lower layer stacked body 120 in the X-direction.

The columnar body CL includes the first widened part a having a large width in the X-direction at the interface between the lower layer stacked body 120 and the upper layer stacked body 140. The first widened part a is adjacent to the first narrowed part A. The first widened part a faces to the insulating layer 40a of the interface between the lower layer stacked body 120 and the upper layer stacked body 140. The width of the first widened part a of the columnar body CL in the X-direction is larger than the width of the first narrowed part A in the X-direction. The width of the first widened part a of the columnar body CL in the X-direction is larger than the width of the second region faces to the conductive layers 70 of the upper layer stacked body 140 in the X-direction. The width of the first widened part a of the columnar body CL in the X-direction is larger than the width of the first region faces to the conductive layer 70 of the lower layer stacked body 120 in the X-direction.

The columnar body CL includes a third region (connection part) having a large width in the X-direction on the substrate 10 side of the first widened part a adjacent to the first widened part a. The third region faces to the insulating layer 40a at the interface between the lower layer stacked body 120 and the upper layer stacked body 140. The width of the third region of the columnar body CL in the X-direction is larger than the width of the first narrowed part A in the X-direction. The width of the third region of the columnar body CL in the X-direction is larger than the width of the second region faces to the conductive layers 70 of the upper layer stacked body 140 in the X-direction. The width of the third region of the columnar body CL in the X-direction is larger than the width of the first region faces to the conductive layers 70 of the lower layer stacked body 120 in the X-direction.

The memory layer 30 is arranged in a cylindrical shape at the side surface of the columnar body CL. The outer surface of the memory layer 30 (the surface in contact with the conductive layers 70 and the insulating layers 40 that are alternately stacked) reflects the shapes of the side surface of the columnar body CL as described above. The inner surface of the memory layer 30 (the surface in contact with the semiconductor layer 20) also reflects the shapes of the side surface of the columnar body CL as described above. That is, the memory layer 30 includes the first narrowed part A having a small outer width (outer diameter, distance between the opposing outer surfaces) in the X-direction at the interface between the lower layer stacked body 120 and the upper layer stacked body 140. The memory layer 30 includes the first widened part a having a large outer width in the X-direction at the interface between the lower layer stacked body 120 and the upper layer stacked body 140. The memory layer 30 includes the third region having a large outer width in the X-direction adjacent to the first widened part a on the substrate 10 side of the first widened part a. Since the magnitude relationship of the outer width of the first widened part a, the first narrowed part A, the first region, the second region, and the third region of the memory layer 30 in the X-direction is same as the magnitude relationship of the width of the first widened part a, the first narrowed part A, the first region, the second region and the third region of the columnar body CL in the X-direction, the description thereof will be omitted here.

The shortest distance (film thickness) between the outer surface of the memory layer 30 (the surface in contact with the conductive layers 70 and the insulating layers 40 that are alternately stacked) and the inner surface of the memory layer 30 (the surface in contact with the semiconductor layer 20) is substantially the same over the entire surface. That is, the film thickness of the memory layer 30 is formed to have a substantially uniform thickness regardless of the shapes of the opening MH and the columnar body CL.

The semiconductor layer 20 is arranged in a bottomed cylindrical shape so as to contact with the inner surface of the memory layer 30 and the epitaxial grown layer 60. The outer surface of the semiconductor layer 20 (the surface in contact with the memory layer 30) reflects the shapes of the side surface of the columnar body CL as described above. The inner surface of the semiconductor layer 20 (the surface in contact with the core layer 50) also reflects the shape of the side surface of the columnar body CL as described above. That is, the semiconductor layer 20 includes the first narrowed part A having a small outer width (outer diameter, the distance between the opposing outer surface) in the X-direction at the interface between the lower layer stacked body 120 and the upper layer stacked body 140. The semiconductor layer 20 includes the first widened part a having a large outer width in the X-direction at the interface between the lower layer stacked body 120 and the upper layer stacked body 140. The semiconductor layer 20 includes the third region having a large outer width in the X-direction adjacent to the first widened part a on the substrate 10 side of the first widened part a. Since the magnitude relationship of the outer width of the first widened part a, the first narrowed part A, the first region, the second region, and the third region of the semiconductor layer 20 in the X direction is same as a magnitude relationship of the outer width of the first widened part a, the first narrowed part A, the first region, the second region, and the third region of the columnar body CL in the X direction, the description thereof is omitted here.

The shortest distances (film thicknesses) between the outer surface of the semiconductor layer 20 (the surface in contact with the memory layer 30) and the inner surface of the semiconductor layer 20 (the surface in contact with the core layer 50) is different in the first widened part a, the first narrowed part A, the first region, the second region, and the third region. The film thickness of semiconductor layer 20 in the first region and the second region is smaller than the film thickness of the semiconductor layer 20 in the first widened part a, the first narrowed part A, and the third region. The minimum film thickness of the semiconductor layer 20 in the first widened part a, the first narrowed part A, and the third region may be larger than the film thickness of the semiconductor layer 20 in the first region and the second region. The smaller film thickness of the semiconductor layer 20 in the first region and the second region allows the semiconductor layer 20 to improve the characteristics of the memory cell MC configured with the opposing memory layer 30 and the conductive layer 70. Since the film thickness of the semiconductor layer 20 in the first widened part a, the first narrowed part A, and the third region is large, discontinuity of the semiconductor layer 20 can be suppressed, and reliability and manufacturing yield can be improved.

In this embodiment, it is shown as an example that the film thickness of the semiconductor layer 20 facing all conductive layers 70 in the first region and the second region is smaller than the film thickness of the semiconductor layer 20 in the first widened part a, the first narrowed part A, and the third region. However, the present embodiment is not limited to this, and the thickness of the semiconductor layer 20 facing the conductive layer 70 on the top layer of the first region and/or the thickness of the semiconductor layer 20 facing the conductive layer 70 on the bottom layer of the second region proximate to the first narrowed part A may be substantially the same as the thickness of the semiconductor layer 20 at the first narrowed part A, as will be described in the following modified examples.

The core layer 50 is arranged in a cylindrical shape so as to contact with the inner surface of the semiconductor layer 20. The outer surface of the core layer 50 (the surface in contact with the semiconductor layer 20) reflects the shape of the side surface of the columnar body CL as described above. That is, the core layer 50 includes the first narrowed part A having a small outer width (outer diameter, distance between the opposing outer surfaces) in the X-direction at the interface between the lower layer stacked body 120 and the upper layer stacked body 140. The core layer 50 includes the first widened part a having an outer width is large in the X-direction at the interface between the lower layer stacked body 120 and the upper layer stacked body 140. The core layer 50 includes the third region having a large outer width in the X-direction adjacent to the first widened part a on the substrate 10 side of the first widened part a. The magnitude relationship of the widths of the first widened part a, the first narrowed part A, the first region, the second region, and the third region of the core layer 50 in the X-direction is same as the magnitude relationship of the widths in the first widened part a, the first narrowed part A, the first region, the second region, and the third region of the columnar body CL in the X-direction, therefore, descriptions thereof is omitted here.

Figure 18:
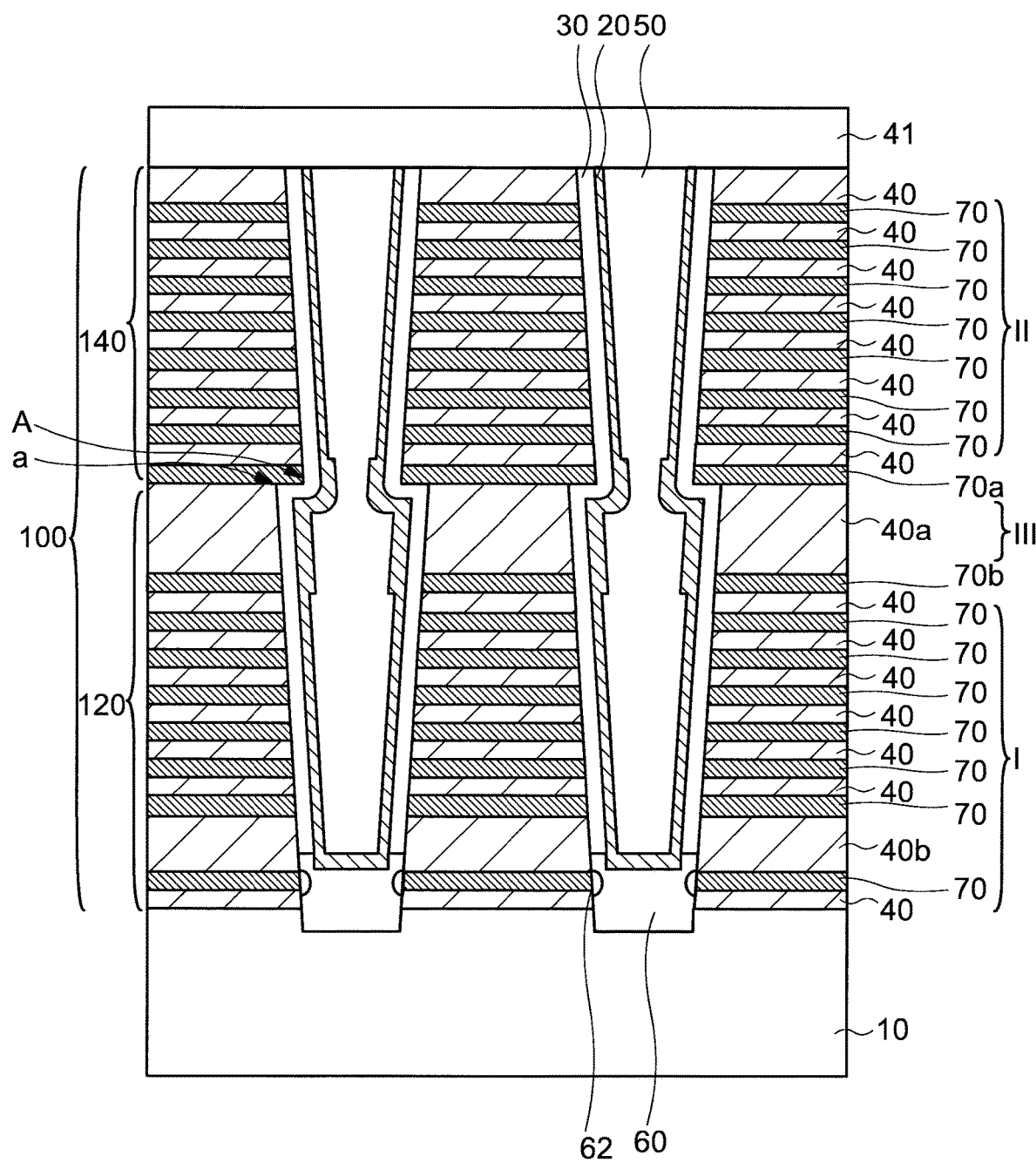
FIG. 18 is a cross-sectional view showing a configuration of a memory cell of a semiconductor memory device according to a modified example.

FIG. 18 shows a modified example in which the conductive layer 70a is arranged between the lowermost conductive layer 70 of the second region and the third region, and the conductive layer 70b is arranged between the uppermost conductive layer 70 of the first region and the third region. The memory cell array according to the present modified example is same as the memory cell array according to the second embodiment except that it includes the conductive layer 70a and the conductive layer 70b. In the following description, a description of the same configuration and manufacturing method as those of the second embodiment will be omitted, and a description will be given mainly of a configuration different from that of the second embodiment.

In this modified example, the conductive layer 70a (third conductive layer) is arranged between the lowermost conductive layer 70 of the second region and the third region. The film thickness of the semiconductor layer 20 facing the conductive layer 70a is substantially same as the film thickness of the semiconductor layer 20 in the third region. The film thickness of the semiconductor layer 20 facing the conductive layer 70a is larger than the film thickness of the semiconductor layer 20 facing the conductive layers 70 of the first region and the conductive layers 70 of the second region. In this instance, the first narrowed part A may oppose the conductive layer 70a below the lowermost conductive layer 70 of the second region. The memory cell MC including the semiconductor layer 20 facing the conductive layer 70a may not function as the memory cell MC.

In this modified example, the conductive layer 70b is further arranged between the uppermost conductive layer 70 of the first region and the third region. The film thickness of the semiconductor layer 20 facing the conductive layer 70b is substantially the same as the film thickness of the semiconductor layer 20 in the third region. The film thickness of the semiconductor layer 20 facing the conductive layer 70b is larger than the film thickness of the semiconductor layer 20 facing the conductive layers 70 of the first region and the conductive layers 70 of the second region. The memory cell MC including the semiconductor layer 20 facing the conductive layer 70b may not function as the memory cell MC. The memory cell array according to the present modified example shows a configuration including the conductive layer 70a and the conductive layer 70b. However, it is not limited thereto, it may be configured to include only one of the conductive layers 70a and the conductive layer 70b.

[Method of Manufacturing Memory Cell Array]

The method of manufacturing the memory cell array 1A according to the second embodiment is same as the method of manufacturing the memory cell array 1 according to the first embodiment except that the joint part J is not formed, and therefore, the description thereof is omitted here.

According to the method of manufacturing the semiconductor memory device according to the present embodiment, since the film thickness of the semiconductor layer 20 in the first region and the second region is small, the semiconductor layer 20 can improve the characteristics of the memory cell MC configured together with facing memory layer 30 and the conductive layer 70. Since the film thickness of the semiconductor layer 20 in the first widened part a, the first narrowed part A, and the third region is large, discontinuity of the semiconductor layer 20 can be suppressed, and reliability and manufacturing yield can be improved.

While the present invention has been described with reference to the drawings, the present invention is not limited to the above embodiments and can be appropriately modified without departing from the spirit of the present invention. For example, a skilled in the art who adds, deletes, or changes designs of components as appropriate based on the semiconductor device of the present embodiment is also included in the scope of the present invention as long as the gist of the present invention is provided. Furthermore, the embodiments described above can be appropriately combined as long as there is no mutual inconsistency, and technical matters common to the embodiments are included in the embodiments even if they are not explicitly described.

Even if it is other working effects that are different from the working effect brought about by the mode of each above-mentioned embodiment, what is clear from the description in this description, or what can be easily predicted by the person skilled in the art is naturally understood to be brought about by the present invention.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device comprising:
  a semiconductor substrate;
  a first stacked body including a plurality of first insulating layers and a plurality of first conductive layers alternately stacked in a first direction intersecting a surface of the semiconductor substrate;
  a second stacked body including a plurality of second insulating layers and a plurality of second conductive layers alternately stacked in the first direction of the first stacked body;
  a third insulating layer arranged between the first stacked body and the second stacked body and having a film thickness larger than a film thickness of each of the plurality of first insulating layer and each of the plurality of second insulating layer; and
  a pillar penetrating the first stacked body, the third insulating layer, and the second stacked body, the pillar comprising a semiconductor layer extending in the first direction and a charge storage layer extending in the first direction and arranged between the plurality of first conductive layers and the semiconductor layer and between the plurality of second conductive layers and the semiconductor layer, wherein
  the pillar has a first region facing one of the plurality of first conductive layers and a connecting part facing the third insulating layer,
  a width of the connection part in a second direction orthogonal to the first direction is larger than a width of the first region in the second direction, and
  a film thickness of the semiconductor layer at the connection part is larger than a film thickness of the semiconductor layer at the first region.

2. The semiconductor memory device according to claim 1, wherein
  the pillar has a second region facing one of the plurality of second conductive layers, and
  the width of the connection part in the second direction is larger than a width of the second region in the second direction.

3. The semiconductor memory device according to claim 2, wherein
  the film thickness of the semiconductor layer at the connection part is larger than a film thickness of the semiconductor layer at the second region.

4. The semiconductor memory device according to claim 3, wherein
  a minimum film thickness of the semiconductor layer at the connection part is larger than the film thickness of the semiconductor layer at the first region and the film thickness of the semiconductor layer at the second region.

5. The semiconductor memory device according to claim 2, wherein the second stacked body further includes a third conductive layer arranged between the lowermost layer of the plurality of second conductive layers and the third insulating layer, and a film thickness of the semiconductor layer in a third region facing the third conductive layer is larger than the film thickness of the semiconductor layer in the first region and the film thickness of the semiconductor layer in the second region.

6. The semiconductor memory device according to claim 1, wherein the pillar functions as a non-volatile memory string together with the plurality of first conductive layers and the plurality of second conductive layers.

7. A method of manufacturing a semiconductor memory device, the method comprising:

forming a first stacked body including a plurality of first insulating layers and a plurality of second insulating layers alternately stacked in a first direction intersecting a surface of a substrate;

forming a third insulating layer on the first stacked body;

forming a second stacked body including a plurality of fourth insulating layers and a plurality of fifth insulating layers alternately stacked in the first direction on the third insulating layer; and forming a tubular body penetrating the first stacked body, the third insulating layer, and the second stacked body, the tubular body comprising a tubular semiconductor layer extending in the first direction and a tubular charge storage layer extending in the first direction and arranged between the plurality of second insulating layers and the tubular semiconductor layer and between the plurality of fifth insulating layers and the tubular semiconductor layer;

wherein the forming the tubular body comprises;

forming a memory hole that penetrates the first stacked body, the third insulating layer, and the second stacked body, forming a semiconductor layer on a side surface and a bottom surface of the memory hole, performing plasma treatment on an inner wall of the semiconductor layer, forming a protective film on a part of the inner wall of the semiconductor layer after performing plasma treatment, and etching at least a part of the inner wall of the semiconductor layer and the protective film after forming the protective film.

8. The method of manufacturing the semiconductor memory device according to claim 7, wherein a film thickness of the third insulating layer is larger than a film thickness of each of the plurality of first insulating layers, and a film thickness of each of the plurality of fourth insulating layers is smaller than the film thickness of the third insulating layer.

9. The method of manufacturing the semiconductor memory device according to claim 7, wherein the performing plasma treatment on the inner wall of the semiconductor layer comprises forming a passivation on a part of the inner wall of the semiconductor layer, and the forming the protective film comprises forming the protective film on the inner wall of the semiconductor layer at a connection part facing the third insulating layer.

10. The method of manufacturing the semiconductor memory device according to claim 7, wherein the forming the protective film comprises supplying a reaction gas, and a flow rate of the reaction gas is controlled to a flow rate that the protective film can be selectively formed on the semiconductor layer of a connection part facing the third insulating layer.

11. The method of manufacturing the semiconductor memory device according to claim 7, wherein the plasma treatment is performed using at least one of a gas selected from a group consisting of $N_2$, Ar, He, $H_2$, $NH_3$, or F.

12. The method of manufacturing the semiconductor memory device according to claim 7, wherein the etching comprises:

forming an oxide film by oxidize a part of the inner wall of the semiconductor layer, and etching under conditions that a selection ratio of the oxide film is higher than a selection ratio of the semiconductor layer.

* * * * *